(12) United States Patent
Gunjishima et al.

(10) Patent No.: US 9,166,008 B2
(45) Date of Patent: Oct. 20, 2015

(54) SIC SINGLE CRYSTAL, SIC WAFER, AND SEMICONDUCTOR DEVICE

(75) Inventors: Itaru Gunjishima, Nagakute (JP); Yasushi Urakami, Obu (JP); Ayumu Adachi, Toyota (JP)

(73) Assignees: KABUSHIKI KAISHA TOYOTA CHUO KENKYUSHO, Nagakute (JP); TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 14/110,574

(22) PCT Filed: May 16, 2012

(86) PCT No.: PCT/JP2012/062448
§ 371 (c)(1),
(2), (4) Date: Oct. 8, 2013

(87) PCT Pub. No.: WO2012/157654
PCT Pub. Date: Nov. 22, 2012

(65) Prior Publication Data
US 2014/0027787 A1      Jan. 30, 2014

(30) Foreign Application Priority Data
May 16, 2011   (JP) ................................ 2011-109773

(51) Int. Cl.
*H01L 31/0312* (2006.01)
*H01L 29/30* (2006.01)
(Continued)

(52) U.S. Cl.
CPC .............. *H01L 29/30* (2013.01); *C30B 23/025* (2013.01); *C30B 29/36* (2013.01); *H01L 29/045* (2013.01);
(Continued)

(58) Field of Classification Search
CPC ................... H01L 21/02447; H01L 21/02529; H01L 29/1608
USPC ............................................ 257/77, E29.104
See application file for complete search history.

(56) References Cited

U.S. PATENT DOCUMENTS

| 7,135,074 B2 | 11/2006 | Gunjishima et al. |
| 2005/0211156 A1 | 9/2005 | Gunjishima et al. |

(Continued)

FOREIGN PATENT DOCUMENTS

| DE | 10 2010 029 755 A1 | 12/2011 |
| JP | H10-45499 A | 2/1998 |

(Continued)

OTHER PUBLICATIONS

Wang, S. et al., "X-Ray Topographic Studies of Defects in PVT 6H-SiC Substrates and Epitaxial 6H-SiC Thin Films." Mat. Res. Symp. Proc. 1994, pp. 735-740, vol. 339.
(Continued)

*Primary Examiner* — Brook Kebede
(74) *Attorney, Agent, or Firm* — Oliff PLC

(57) ABSTRACT

An SiC single crystal having at least one orientation region where a basal plane dislocation has a high linearity and is oriented to three crystallographically-equivalent <11-20> directions, and an SiC wafer and a semiconductor device which are manufactured from the SiC single crystal. The SiC single crystal can be manufactured by using a seed crystal in which the offset angle on a {0001} plane uppermost part side is small and the offset angle on an offset direction downstream side is large and growing another crystal on the seed crystal.

12 Claims, 18 Drawing Sheets

(51) Int. Cl.
- H01L 29/04 (2006.01)
- H01L 29/16 (2006.01)
- C30B 23/02 (2006.01)
- C30B 29/36 (2006.01)
- H01L 29/32 (2006.01)
- H01L 29/861 (2006.01)
- H01L 21/02 (2006.01)

(52) U.S. Cl.
CPC ............ H01L 29/1608 (2013.01); H01L 29/32 (2013.01); *H01L 21/0254* (2013.01); *H01L 21/02378* (2013.01); *H01L 21/02433* (2013.01); *H01L 21/02529* (2013.01); *H01L 29/861* (2013.01)

(56) References Cited

U.S. PATENT DOCUMENTS

| | | | |
|---|---|---|---|
| 2011/0006309 A1* | 1/2011 | Momose et al. | 257/77 |
| 2011/0024766 A1* | 2/2011 | Jenny et al. | 257/77 |
| 2012/0060751 A1 | 3/2012 | Urakami et al. | |
| 2014/0027787 A1 | 1/2014 | Gunjishima et al. | |

FOREIGN PATENT DOCUMENTS

| | | |
|---|---|---|
| JP | A-2003-119097 | 4/2003 |
| JP | A-2004-323348 | 11/2004 |
| JP | A-2006-225232 | 8/2006 |
| JP | A-2010-235390 | 10/2010 |
| JP | A-2012-046377 | 3/2012 |
| JP | A-2012-072034 | 4/2012 |
| JP | A-2012-116676 | 6/2012 |
| WO | 2012/157654 A1 | 11/2012 |

OTHER PUBLICATIONS

Kamata, I. et al., "Characterization of Basal Plane Dislocations in 4H-SiC Substrates by Topography Analysis of Threading Edge Dislocations in Epilayers." Materials Science Forum. 2010, pp. 303-306, vols. 645-648.

Kallinger, B. et al., "Dislocation Conversion and Propagation during Homoepitaxial Growth of 4H-SiC." ICSCRM2009 Technical Digest Tu-2A-2.

Stahlbush, R.E. et al., "A Pictorial Tracking of Basal Plane Dislocations in SiC Epitaxy." Materials Science Forum. 2010, pp. 271-276, vols. 645-648.

Nakamura, D. et al., "Topographic study of dislocation structure in hexagonal SiC single crystals with low dislocation density." Journal of Crystal Growth. 2007, pp. 57-63, vol. 304.

Jul. 31, 2012 International Search Report issued in PCT Application No. PCT/JP2012/062448.

Aug. 26, 2014 Office Action issued in Japanese Application No. 2011-109773 (with English translation).

Nov. 28, 2013 International Preliminary Report on Patentability issued in PCT Application No. PCT/JP2012/062448.

Jan. 15, 2014 International Written Opinion issued in International Patent Application No. PCT/JP2013/006389.

Jan. 15, 2014 International Search Report issued in International Patent Application No. PCT/JP2013/006389.

E. K. Sanchez, et al., "Nucleation of threading dislocations in sublimation grown silicon carbide," Journal of Applied Physics, vol. 91, No. 3, (2002), pp. 1143-1148.

Apr. 30, 2015 Office Action issued in Swedish Patent Application No. 1351437-7.

May 12, 2015 Office Action issued in Japanese Application No. 2011-109733.

Jan. 22, 2015 Office Action issued in Korean Application No. 10-2013-7033382.

Jul. 27, 2015 Office Action issued in Korean Application No. 10-2013-7033382.

Jul. 17, 2015 Office Action issued in Chinese Application No. 201280023709.2.

* cited by examiner

US 9,166,008 B2

SIC SINGLE CRYSTAL, SIC WAFER, AND SEMICONDUCTOR DEVICE

FIELD OF THE INVENTION

The present invention relates: to an SiC single crystal, an SiC wafer, and a semiconductor device; more specifically to an SiC single crystal having a highly-linear and highly-oriented basal plane dislocation, and an SiC wafer and a semiconductor device manufactured from such an SiC single crystal.

BACKGROUND OF THE INVENTION

In SiC (silicon carbide), a high-temperature type ($\alpha$-type) having a hexagonal crystal structure and a low-temperature type ($\beta$-type) having a cubic crystal structure are known. SiC is characterized, in comparison with Si, by having a high thermal resistance, a broad band gap, and a high dielectric breakdown electric field strength. For that reason, a semiconductor including an SiC single crystal is expected as a candidate material of a next-generation power device substituting for an Si semiconductor. In particular, $\alpha$-type SiC has a band gap broader than $\beta$-type SiC and hence the $\alpha$-type SiC attracts attention as a semiconductor material of an ultralow power-loss power device.

$\alpha$-type SiC has a {0001} plane (hereunder referred to also as "c-plane") as the principal crystal plane and a {1-100} plane and a {11-20} plane (hereunder referred to also as "a-plane" collectively) perpendicular to the {0001} plane.

A c-plane growth method has heretofore been known as a method of obtaining an $\alpha$-type SiC single crystal. The "c-plane growth method" cited here means a method of using as a seed crystal an SiC single crystal in which a c-plane or a plane having an offset angle to the c-plane in a prescribed range is exposed as a growth plane and growing an SiC single crystal over the growth plane by a sublimation reprecipitation method or the like.

The problem has, however, been that, in a single crystal obtained by the c-plane growth method, a large number of defects such as micro pipe defects (tubular voids about several $\mu$m to 100 $\mu$m in diameter) and threading screw dislocations (hereunder referred to also merely as "screw dislocations") are generated in the direction parallel to the <0001> direction. Meanwhile, in a c-plane grown crystal, many basal plane dislocations exist in the c-plane and they are complexly intertwined with the screw dislocations in the c-axis direction (Non-patent Literature 1).

In particular, a basal plane dislocation curves largely in a {0001} plane by intertwinement between dislocations. In the case where a basal plane dislocation curves in this way, when a substrate (usually sliced so as to form an offset angle of 4° to 8° to a {0001} plane in order to form an epitaxial film) for manufacturing a device is taken from a single crystal, it sometimes happens that one basal plane dislocation may be exposed at plural sites on the surface of the substrate (refer to FIG. 15). As a result, the dislocation is succeeded from the plural sites when the epitaxial film is formed (Non-patent Literatures 2 and 3).

Further, in the case where a basal plane dislocation curves, the basal plane dislocation is oriented to various directions crystallographically. When a device is manufactured with such a single crystal and the device is operated, a stacking fault is formed by the decomposition of the basal plane dislocation into partial dislocations oriented to a crystallographically stable direction (<11-20> direction) during the operation (refer to FIG. 16) and the degradation of the device characteristics (a forward degradation phenomenon in a bipolar device) may sometimes be caused (Non-patent Literature 4).

A line must not be a straight line in order that the line intersects with a plane at plural sites. It would be better for a line to be rectilinear in order to reduce the number of the intersection sites. Consequently, it is geometrically obvious that it is better to reduce the number density and the total length of a basal plane dislocation and make it rectilinear in order to prevent the basal plane dislocation from being exposed at plural sites on a substrate surface (refer to FIG. 17). Further, in the case where a basal plane dislocation is oriented to a crystallographically stable direction, the basal plane dislocation hardly decomposes into partial dislocations and hence it is desirable to orient the basal plane dislocation to such a crystallographically stable direction (refer to FIG. 18). It is estimated that influence on the characteristics of a device may be reduced by so doing.

Meanwhile, as described in Patent Literature 1, it is possible to reduce a dislocation density in a crystal by using a method (RAF method) in which a c-plane growth is performed after a repeated a-plane growth. Further, in Non-patent Literature 5, it is described that a basal plane dislocation tends to be oriented by the RAF method. In the literature, however, a measure for judging the existence of orientation and linearity is not obvious. Further, a dislocation density is still high, intertwinement with a threading defect occurs frequently. Although the tendency of orientation is recognized partially in each of dislocations, the linearity is not strong and many curved parts exist. Furthermore, such a region is limited to a region of the order of submillimeters.

CITATION LIST

Patent Literature

[Patent Literature 1] Japanese Patent Application Laid-Open No. 2003-119097

Non-Patent Literature

[Non-patent Literature 1] S. Wang et al., Mater. Res. Soc. Symp. Proc. 339 (1994) 735
[Non-patent Literature 2] I. Kamata et al., Materials Science Forum vols. 645-648 (2010) pp. 303-306
[Non-patent Literature 3] B. Kallinger et al., ICSCRM2009 Technical Digest Tu-2A-2
[Non-patent Literature 4] R. E. Stahlbush et al., Materials Science Forum vols. 645-648 (2010) pp. 271-276
[Non-patent Literature 5] D. Nakamura et al., Journal of Crystal Growth 304 (2007) 57-63

SUMMARY OF THE INVENTION

A problem to be solved by the present invention is to provide an SiC single crystal having a highly-linear basal plane dislocation highly oriented to a stable <11-20> direction, and an SiC wafer and a semiconductor device manufactured from such an SiC single crystal.

In order to solve the above problem, an SiC single crystal according to the present invention has the following configuration:
(1) the SiC single crystal has at least one orientation region where a basal plane dislocation has a high linearity and is oriented to three crystallographically-equivalent <11-20> directions; and (2) the "orientation region" means a region judged through the following procedures,
   (a) a wafer with the surface nearly parallel to a {0001} plane is cut out from the SiC single crystal,
   (b) X-ray topography measurement by transmission arrangement is applied to the wafer and X-ray topography images corresponding to three crystallographically-equivalent {1-100} plane diffractions are photographed,
   (c) each of the three X-ray topography images is transformed into a digital image obtained by quantifying the brightness of each point in the image and each of the three digital images is comparted into a square measurement region where the length L of each side is 10±0.1 mm,
   (d) two-dimensional Fourier transform processing is applied to each of the digital images in the three measurement regions corresponding to an identical region on the wafer and a power spectrum (spectrum of the amplitude A of a Fourier coefficient) is obtained,
   (e) each of the three power spectra is converted into a polar coordinate function and a function $A_{ave.}(\theta)$ of angle (direction) dependency of an average amplitude A is obtained (0°≤θ≤180°),
   (f) an integrated value $A'_{ave.}(\theta)$ of the three $A_{ave.}(\theta)$'s is shown in a graph (x-axis: θ, y-axis: $A'_{ave.}$) and the ratio of a peak value $A'_{ave.}(\theta_i)$ to a background $B.G.(\theta_i)$ ($=A'_{ave.}(\theta_i)/B.G.(\theta_i)$ ratio) is computed for each of three $\theta_i$'s (i=1 to 3) corresponding to the three <1-100> directions, and
   (g) when all of the three $A'_{ave.}(\theta_i)/B.G.(\theta_i)$ ratios are 1.1 or more, the region of the wafer corresponding to the three measurement regions is judged as an "orientation region".

An SiC wafer according to the present invention includes a wafer cut out in nearly parallel to a {0001} plane from the SiC single crystal according to the present invention.

Further, a semiconductor device according to the present invention includes a device manufactured by using the SiC wafer according to the present invention.

In the case where an SiC single crystal is grown on a c-plane, by using a seed crystal in which the offset angle of a surface satisfies specific conditions, it is possible to obtain the SiC single crystal having a highly-linear basal plane dislocation highly oriented to a stable <11-20> direction.

When a wafer is cut out in nearly parallel to a {0001} plane from such an SiC single crystal, the number of basal plane dislocations exposed on the wafer surface reduces relatively. As a result, even when an SiC single crystal is grown by using such a wafer as a seed crystal or an epitaxial film is formed on the wafer surface, the number of dislocations succeeded by a grown crystal or an epitaxial film also reduces.

Further, when a semiconductor device is manufactured by using such an SiC single crystal, it is possible to suppress the generation of a stacking fault caused by the decomposition of a curved basal plane dislocation during use and the degradation of device characteristics caused by the generation of the stacking fault.

BRIEF DESCRIPTION OF THE DRAWINGS

FIG. 4A is a digital image and FIGS. 4B to 4K are sinusoidal waveforms constituting the digital image in FIG. 4A.

DETAILED DESCRIPTION OF THE PREFERRED EMBODIMENTS

Figure 1:
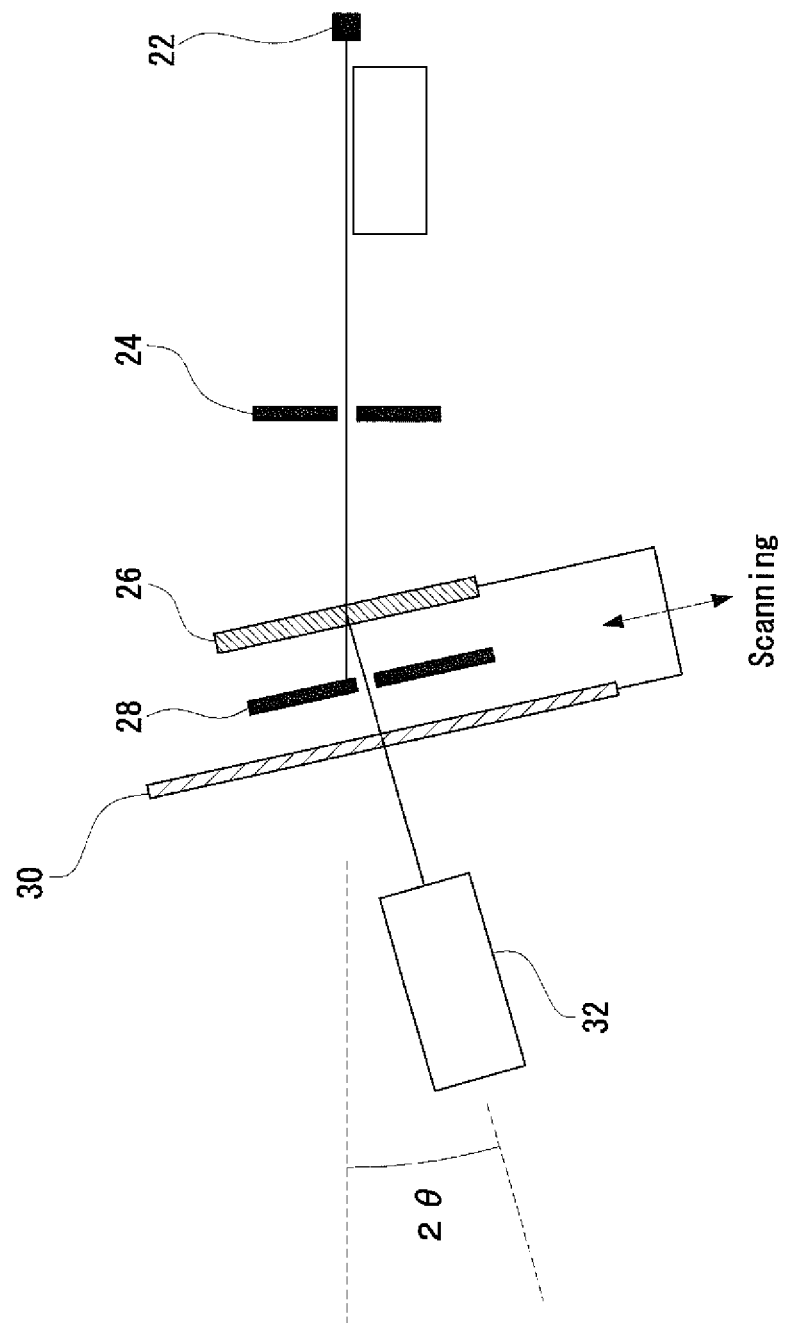
FIG. 1 is a schematic illustration of a Lang method (transmission arrangement topography)

An embodiment according to the present invention is explained hereunder in detail.

[1. SiC Single Crystal]

An SiC single crystal according to the present invention has the following configuration:

(1) the SiC single crystal has at least one orientation region where a basal plane dislocation has a high linearity and is oriented to three crystallographically-equivalent <11-20> directions; and (2) the "orientation region" means a region judged through the following procedures, (a) a wafer with the surface nearly parallel to a {0001} plane is cut out from the SiC single crystal, (b) X-ray topography measurement by transmission arrangement is applied to the wafer and X-ray topography images corresponding to three crystallographically-equivalent {1-100} plane diffractions are photographed, (c) each of the three X-ray topography images is transformed into a digital image obtained by quantifying the brightness of each point in the image and each of the three digital images is comparted into a square measurement region where the length L of each side is 10±0.1 mm, (d) two-dimensional Fourier transform processing is applied to each of the digital images in the three measurement regions corresponding to an identical region on the wafer and a power spectrum (spectrum of the amplitude A of a Fourier coefficient) is obtained, (e) each of the three power spectra is converted into a polar coordinate function and a function $A_{ave.}(\theta)$ of angle (direction) dependency of an average amplitude A is obtained (0°≤θ≤180°), (f) an integrated value $A'_{ave.}(\theta)$ of the three $A_{ave.}(\theta)$'s is shown in a graph (x-axis: θ, y-axis: $A'_{ave.}$) and the ratio of a peak value $A'_{ave.}(\theta_i)$ to a background $B.G.(\theta_i)$ ($A'_{ave.}(\theta_i)/B.G.(\theta_i)$ ratio) is computed for each of three $\theta_i$'s (i=1 to 3) corresponding to the three <1-100> directions, and (g) when all of the three $A'_{ave.}(\theta_i)/B.G.(\theta_i)$ ratios are 1.1 or more, the region of the wafer corresponding to the three measurement regions is judged as an "orientation region".

[1.1. Orientation Region]

An "orientation region" means a region where a basal plane dislocation has a high linearity and is oriented to three crystallographically-equivalent <11-20> directions. Whether or not linearity is high and a basal plane dislocation is highly oriented can be judged by computing an $A'_{ave.}(\theta_i)/B.G.(\theta_1)$ ratio from an X-ray topography image. The details of the judging method are described later. An SiC single crystal only has to have at least one such orientation region in the interior.

In the case where an SiC single crystal is grown on a c-plane, generally an offset substrate is used for a seed crystal. A c-plane facet as the tip of growth exists at an end of an offset substrate on the upstream side in the offset direction. In order to suppress the generation of heterogeneous polytype, a screw dislocation functioning to take over the polytype of a seed crystal in a growth direction needs to exist in a c-plane facet. As a method for introducing a screw dislocation in a c-plane facet, there is a method of introducing a screw dislocation generation region at an end of a seed crystal on the upstream side in an offset direction, for example.

When a c-plane growth is performed by using such a seed crystal, a deep-colored trace of a c-plane facet (facet mark) caused by a relatively large quantity of trapped nitrogen remains on the upstream side in an offset direction of a grown crystal. Further, a stacking fault and a basal plane dislocation included in a screw dislocation generation region in a seed crystal are taken over by a grown crystal in accordance with growth and flow out toward the downstream side in an offset direction and hence the densities of the screw dislocation and the basal plane dislocation increase. As a result, by an existing c-plane growth method, the basal plane dislocation tends to curve even in a region apart from a facet mark and orientation thereof deteriorates.

In contrast, by using a method described later, it is possible to obtain an SiC single crystal having at least one orientation region existing in a region where a facet mark is excluded. A region where a facet mark exists corresponds to a screw dislocation generation region and hence is intrinsically unsuitable for manufacturing a device. For that reason, it is desirable that an orientation region exists in a region where a facet mark does not exist.

Further, in the case of manufacturing an SiC single crystal by a method described later, when an offset substrate having a c-plane facet at an end is used for a seed crystal, it is possible to obtain an SiC single crystal having at least one orientation region existing nearly in the center of the SiC single crystal. Here, "nearly in the center of an SiC single crystal" means in the vicinity of the center of the surface of a wafer cut out in nearly parallel to a {0001} plane from the SiC single crystal. Since a device is generally formed in a region excluding an end of a wafer, it is desirable that an orientation region exists nearly in the center of a single crystal.

Further, by using a method described later, it is possible to obtain an SiC single crystal having a higher orientation intensity B as a distance from a facet mark increases.

"Having a higher orientation intensity B as a distance from a facet mark increases" means specifically that:

(1) an SiC single crystal has a first orientation region the distance of which to a facet mark is $L_1$ and a second region the distance of which to the facet mark is $L_2$ ($>L_1$); and (2) an orientation intensity B (=average of the three $A'_{ave.}(\theta_i)/B.G.(\theta_i)$ ratios) corresponding to the second orientation region is larger than the orientation intensity B corresponding to the first orientation region.

A "distance ($L_1$ or $L_2$) between a facet mark and an orientation region" means a distance between the center of a facet mark appearing on the surface of a wafer and the center of an orientation region when the wafer is cut out in nearly parallel to a {0001} plane from an SiC single crystal. A region where a facet mark exists corresponds to a screw dislocation generation region and hence is intrinsically unsuitable for manufacturing a device. For that reason, it is desirable that an orientation region exists in a region apart from a facet mark. Further, it is possible to improve the orientation and linearity of a basal plane dislocation in one of the <11-20> directions by bringing the <11-20> direction near to the offset direction.

[1.2. Area Ratio of Orientation Region]

The "area ratio of an orientation region (%)" means the proportion of the sum (S) of the areas of orientation regions to the sum ($S_0$) of the areas of measurement regions (=S×100/$S_0$) included in a wafer cut out in nearly parallel to a {0001} plane from an SiC single crystal.

In order to cut out a wafer in nearly parallel to a {0001} plane from an SiC single crystal and manufacture a high-performance semiconductor device at a high yield by using the cut out wafer, it is better for the area ratio of an orientation region to be increased to the largest possible extent. The area ratio of an orientation region is preferably 50% or more, yet preferably 70% or more, and still yet preferably 90% or more.

By using a method described later, it is possible to obtain an SiC single crystal including a relatively large amount of orientation region. Further, by optimizing the manufacturing conditions, it is possible to obtain an SiC single crystal allowing the area ratio of an orientation region of at least one wafer to be 50% or more when one or more wafers are cut out from the SiC single crystal.

[1.3. Orientation Intensity B]

An "orientation intensity B" means the average of three $A'_{ave.}(\theta_i)/B.G.(\theta_i)$ ratios (i=1 to 3) corresponding to three crystallographically-equivalent <1-100> directions. It shows that, as an orientation intensity B increases, a basal plane dislocation has a higher linearity and a higher orientation in the <11-20> direction.

In the case of using a method described later, by optimizing the manufacturing conditions, it is possible to obtain an SiC single crystal including at least one orientation region having an orientation intensity B of 1.2 or more.

In order to cut out a wafer in nearly parallel to a {0001} plane from an SiC single crystal and manufacture a high-performance semiconductor device at a high yield by using the cut out wafer, it is better for the orientation intensity B of an orientation region to be increased to the largest possible extent. An orientation intensity B is preferably 1.3 or more, yet preferably 1.4 or more, and still yet preferably 1.5 or more.

Likewise, it is better for the area ratio of an orientation region having such a high orientation intensity B to be increased to the largest possible extent.

[1.4. Stacking Fault]

"Not including a stacking fault" means that a planarly-projected plane defect region is not included in an X-ray topography image corresponding to {1-100} plane diffraction.

When an SiC single crystal according to the present invention is manufactured by using a method described later, a stacking fault included in a screw dislocation generation region hardly flows out toward the downstream side in the offset direction and hence a stacking fault density immediately after manufacturing is low. Further, simultaneously a basal plane dislocation also hardly flows out, the transformation of an edge of a stacking fault into a screw dislocation does not occur, and hence interaction between dislocations hardly occurs. As a result, a basal plane dislocation is highly oriented, in other words a curved basal plane dislocation reduces, and a stacking fault caused by the decomposition of a curved basal plane dislocation is inhibited from being generated.

[2. Judgment Method of Orientation Region]

An "orientation region" is judged through the following procedures.

[2.1. Processing of Specimen: Procedure (a)]

Firstly, a wafer with the surface nearly parallel to a {0001} plane is cut out from an SiC single crystal.

In the present invention, the procedure is based on the premise that general processing of a specimen for imaging a basal plane dislocation ({0001} in-plane dislocation) by X-ray topography is applied. Specifically, processing is applied under the following conditions.

That is, a wafer having an offset angle of 10° or less is cut out by slicing an SiC single crystal in nearly parallel to a {0001} plane. A wafer having a thickness suitable for X-ray topography measurement is produced by grinding and polishing and thus flattening the wafer surface and further removing a damaged layer on the surface. CMP treatment is preferably used for removing a damaged layer.

If a wafer is too thin, a measured region is localized in the thickness direction, resultantly an average dislocation structure in a crystal cannot be evaluated, and the measured value of an orientation intensity tends to vary. If a wafer is too thick in contrast, X-rays hardly transmit. Consequently, the thickness of a wafer is preferably 100 to 1,000 μm, yet preferably 500±200 μm, and still yet preferably 500±100 μm.

[2.2. X-Ray Topography: Procedure (b)]

Successively, X-ray topography measurement by transmission arrangement is applied to the wafer and X-ray topography images corresponding to three crystallographically-equivalent {1-100} plane diffractions are photographed.

In the present invention, the procedure is based on the premise that the measurement is carried out under ordinary X-ray topography measurement conditions for detecting a basal plane dislocation image. Specifically, the measurement is applied under the following conditions:

Arrangement: transmission arrangement (Lang method, refer to FIG. 1), and

Figure 2:
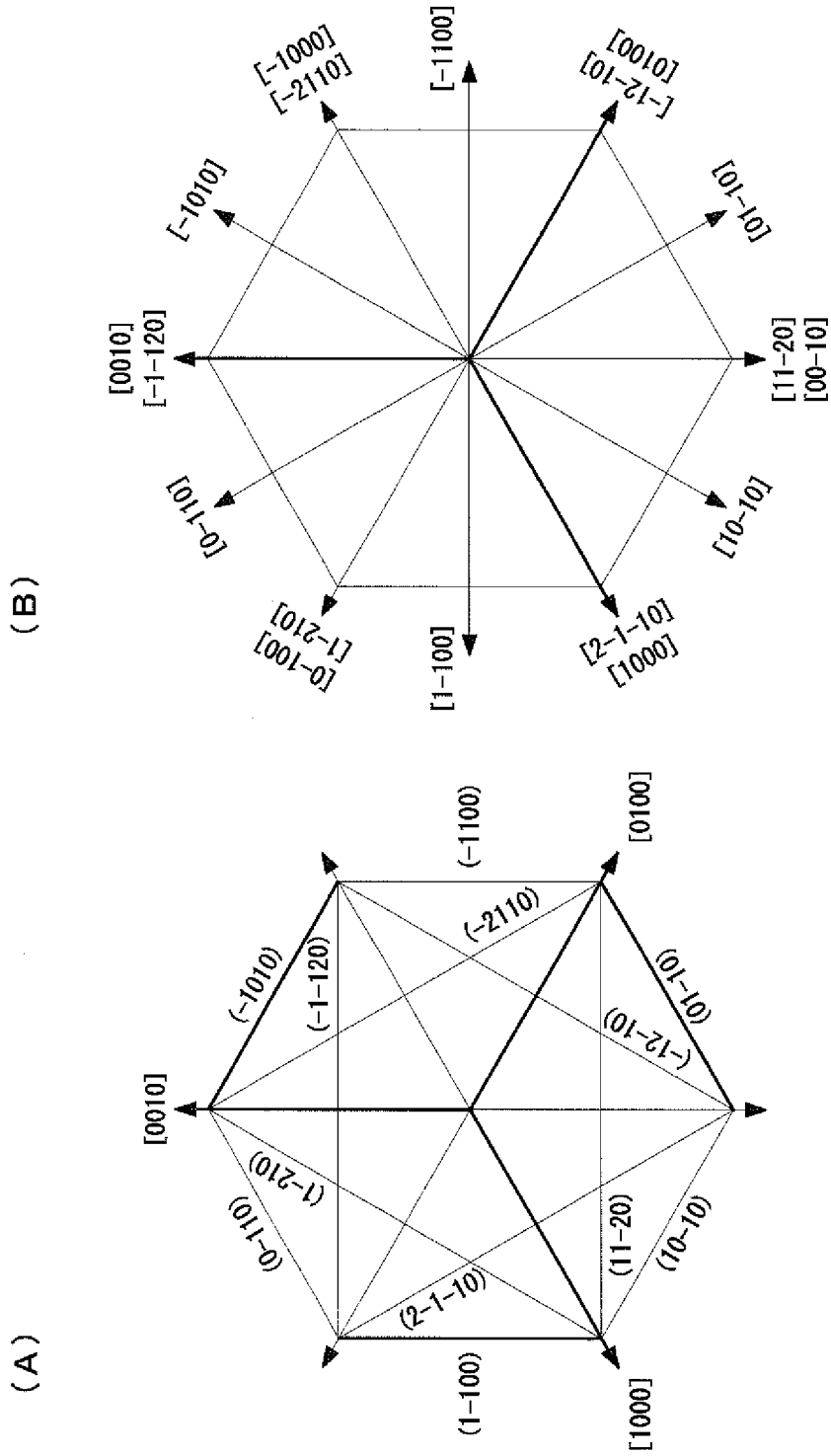
FIG. 2A is a schematic illustration showing crystal planes of a hexagonal system.
FIG. 2B is a schematic illustration showing the crystal orientation of a hexagonal system.

Diffraction conditions and measurement plane: {1-100} plane diffraction is used. This is diffraction mainly aimed at detecting a dislocation and a defect having a Burgers vector in a {0001} in-plane direction and a {0001} in-plane stacking fault can also be detected. An identical region of a crystal is measured by the combination of three crystallographically-equivalent planes having different angles. The three planes are a (1-100) plane, a (−1010) plane, and a (01-10) plane. Refer to FIG. 2A.

A Lang method (transmission arrangement topography) is a means to be able to: photograph a defect distribution of a whole wafer; and be used for the quality inspection of a wafer. In the Lang method, there are a method of using large-scale synchrotron radiation facility and a method of using a small-scale X-ray generator of a laboratory level. The measurement described in the present invention can be carried out by either of the methods. A general technique applied to latter method is explained here.

As shown in FIG. 1, X-rays emitted from an X-ray source 22 are directed and narrowed with a first slit 24 and incident on a specimen 26. The incident X-rays irradiate a strip-shaped region of the specimen 26. When an orientation in a specimen plane and an incidence angle are adjusted so as to satisfy diffraction conditions to a lattice plane of a crystal, diffraction occurs in the whole irradiated area.

An X-ray tube having Mo as the anode is used as the X-ray source 22 and the diffraction conditions are tailored to the wavelength of $K_{\alpha 1}$ in the $K_\alpha$ rays of characteristic X-rays. A second slit 28 has the functions of blocking primary X-rays coming through the specimen 26, appropriately narrowing the width so as to let only diffracted X-rays through, and reducing backgrounds caused by scattered X-rays. A film (or nuclear emulsion plate) 30 is arranged on the rear side of the second slit 28 and an X-ray detector 32 is arranged further on the rear side thereof.

With the arrangement, by scanning the specimen 26 in parallel to the specimen plane together with the film 30, a diffraction image ranging over the whole specimen 26 can be obtained.

A topograph thus obtained is called a traverse topograph. The topograph may sometimes be called a projection topograph because a three-dimensional defect image is projected two-dimensionally.

As a method for detecting a dislocation having a Burgers vector in a {0001} in-plane direction, generally {11-20} plane diffraction is also used. By the {11-20} plane diffraction, however, a stacking fault in a {0001} plane cannot be detected.

Meanwhile, whereas a dislocation having Burgers vectors of the three principal axes directions in a {0001} plane can be detected even in one measurement plane by the {11-20} plane diffraction, only a dislocation having Burgers vectors of two principal axes directions in the three principal axes directions is detected in one measurement plane by {1-100} plane diffraction.

In the present invention therefore, {1-100} plane diffraction capable of detecting also a stacking fault is used and the measurement is applied to three crystallographically-equivalent crystal planes having different angles.

[2.3. Digitization and Image Preprocessing of Topography Image: Procedure (c)]

Successively, each of the three X-ray topography images is transformed into a digital image obtained by quantifying the brightness of each point in the image and each of the three digital images is comparted into a measurement region having a size of 10±0.1 mm.

In the present invention, the procedure is based on the premise that general image processing for carrying out image analysis is applied. Specifically, digitization and image preprocessing are carried out under the following conditions.

(1) A topography image obtained on a film or a nuclear emulsion plate is digitized with a scanner or the like. The scanning conditions at the digitization are shown below:
Resolution: 512 pixels/cm or more in the actual size of a film, and
Mode: gray scale.

(2) A digitized topography image (digital image) is comparted into a square measurement region where the length L of each side is 10±0.1 mm. When the size of a wafer is relatively large, the wafer surface is comparted into squares and a plurality of measurement regions are taken out. In general, if a measurement region is too small, the measurement is localized and the result corresponding to an average structure of a dislocation in a crystal is not obtained. In contrast, if a measurement region is too large, a basal plane dislocation image is too thin and obscure and orientation is hard to examine.

(3) The gray level of a digital image is adjusted so as to be able to obtain a clear basal plane dislocation image. Specifically, the part of a basal plane dislocation is adjusted to darkest (black) and a part other than a dislocation is adjusted to lightest (white).

(4) The number of pixels on a side is adjusted to 512 pixels. If the number of pixels is too small, a clear basal plane dislocation image is not obtained. In contrast, if the number of pixels is too large, Fourier transform processing becomes slow.

[2.4. Image Analysis: Procedure (d)]

Successively, two-dimensional Fourier transform processing is applied to each of the three digital images in the measurement region corresponding to an identical region on a wafer and a power spectrum (spectrum of the amplitude A of a Fourier coefficient) is obtained.

The principle of image analysis by two-dimensional Fourier transform is described in detail in the following literatures for example;

(1) Toshiharu Enomae, "Novel techniques for analyzing physical properties of paper using image processing", Kami Parupu Gijutsu Times (Pulp and Paper Technology Times), 48(11), 1-5 (2005) (Reference Literature 1), (2) Enomae, T., Han, Y.-H. and Isogai, A., "Fiber orientation distribution of paper surface calculated by image analysis", Proceedings of International Papermaking and Environment Conference, Tianjin, P. R. China (May 12-14), Book 2, 355-368 (2004) (Reference Literature 2), (3) Enomae, T., Han, Y.-H. and Isogai, A., "Nondestructive determination of fiber orientation distribution of fiber surface by image analysis", Nordic Pulp Research Journal 21(2): 253-259 (2006) (Reference Literature 3), (4) http://psl.fp.a.u-tokyo.ac.jp/hp/enomae/FiberOri/ (as of April, 2011) (Reference URL 1).

[2.5. Computation of $A'_{ave.}(\theta_i)/B.G.(\theta_i)$ ratio: procedures (e) to (g)]

Successively, each of the three power spectra is converted into a polar coordinate function and a function $A_{ave.}(\theta)$ of angle (direction) dependency of an average amplitude A is obtained ($0° \leq \theta \leq 180°$) (procedure (e)). In the conversion into a polar coordinate function, the following processing is applied. In a power spectrum, an average amplitude A at an angle $\theta$ in the counterclockwise direction from $0°$ of the x-axis direction is computed. That is, $\theta$ is equally divided in the range of $0°$ to $180°$ and the average of the amplitudes of Fourier coefficients from the center to the end of a power spectrum is obtained at each angle.

Successively, an integrated value $A'_{ave.}(\theta)$ of the three $A_{ave.}(\theta)$'s is shown in a graph (x-axis: $\theta$, y-axis: $A'_{ave.}$) and the ratio of a peak value $A'_{ave.}(\theta_i)$ to a background $B.G.(\theta_i)$ ($=A'_{ave.}(\theta_i)/B.G.(\theta_i)$ ratio) is computed at each of three $\theta_i$'s (i=1 to 3) corresponding to the three <1-100> directions (procedure (f)). When all of the three $A'_{ave.}(\theta_i)/B.G.(\theta_i)$ ratios thus obtained are 1.1 or more, the region of the wafer corresponding to the three measurement regions is judged as an "orientation region" (procedure (g)).

Figure 3:
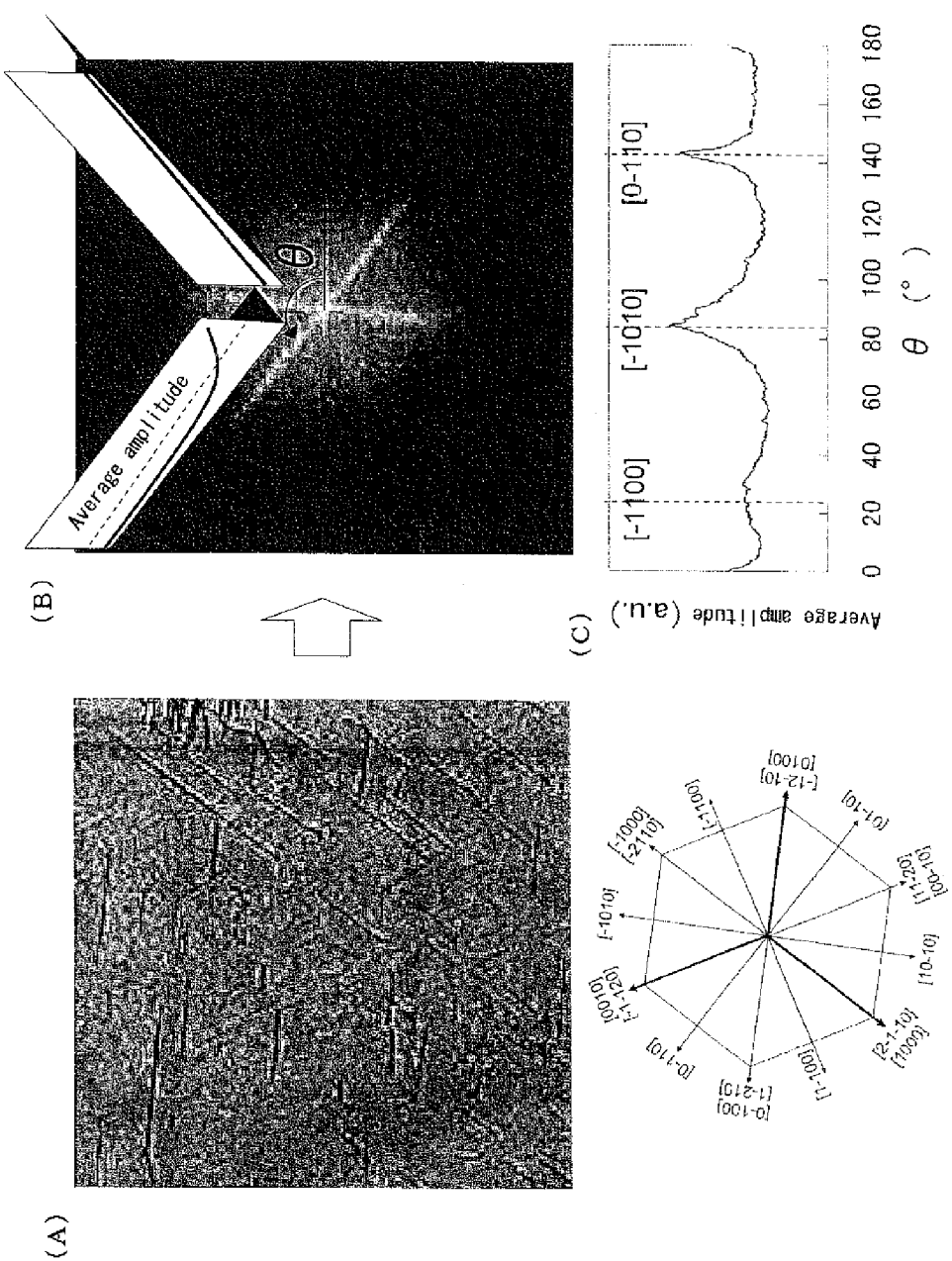
FIG. 3A is an example of a digitized X-ray topography image (basal plane dislocation image) (upper figure) and a schematic illustration of the crystal orientation (lower figure)
FIG. 3B is a power spectrum (spectrum of the amplitude A of a Fourier coefficient) obtained by applying two-dimensional Fourier transform to the digital image in FIG. 3A.
FIG. 3C is a graph showing the angle dependency of an average amplitude.
Figure 4:
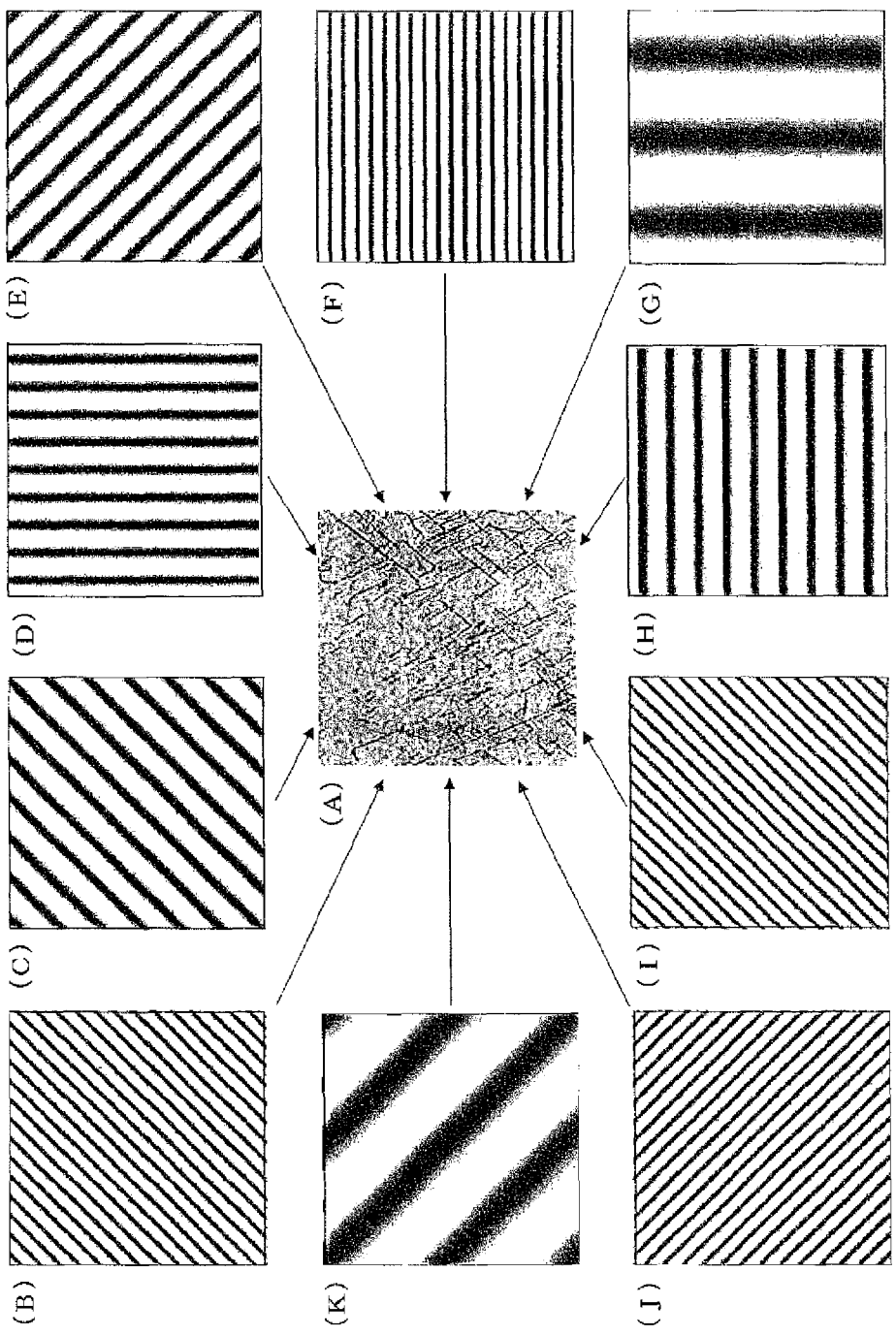
FIGS. 4A to 4K are schematic illustrations for explaining two-dimensional Fourier transform of an image.

FIG. 3A shows an example of a digitized X-ray topography image (basal plane dislocation image). A power spectrum is obtained by applying two-dimensional Fourier transform to the digital image (FIG. 3B). The power spectrum is converted to a function of polar coordinates, an average of amplitudes is obtained at an angle (direction of periodicity), and a. function $A_{ave.}(\theta)$ of the angle (direction) dependency of the average amplitude is obtained (FIG. 3C). The processing is applied to each of the basal plane dislocation images obtained under the three diffraction conditions and the function $A_{ave.}(\theta)$'s of the angle dependency of the three obtained average amplitudes are integrated.

In the graph of an integrated value $A'_{ave.}(\theta)$, the ratio of a peak value $A'_{ave.}(\theta_i)$ to a background $B.G.(\theta_i)$ ($=A'_{ave.}(\theta_i)/B.G.(\theta_i)$ ratio) is computed for each of the three $\theta_i$'s (i=1 to 3) corresponding to the <1-100> directions.

A "background $B.G.(\theta_i)$" means the distance from the x-axis to a background line at the position of $\theta_i$. A "background line" means a tangent line touching the bottom end of the graph of the integrated value $A'_{ave.}(\theta)$ in the vicinity of $\theta_i$ (refer to FIG. 11).

When a clear peak is shown at each of the three $\theta_i$'s (i=1 to 3) corresponding to the <1-100> directions by applying appropriate image processing, the region on the wafer corresponding to the measurement regions is judged as an "orientation region". A "clear peak" means that an $A'_{ave.}(\theta_i)/B.G.(\theta_i)$ ratio (i=1 to 3) is 1.1 or more.

In Fourier transform, a peak appears in a direction perpendicular to an actual orientation direction. In a crystal structure of a hexagonal system such as SiC, the direction perpendicular to the <11-20> direction is the <1-100> direction (FIG. 2B). That is, that a peak appears in the <1-100> direction by Fourier transform represents that a basal plane dislocation is oriented to the <11-20> direction. Further, that an orientation intensity B (=average of the three $A'_{ave.}(\theta_i)/B.G.(\theta_i)$ ratios) is large represents that the orientation of a basal plane dislocation to the <11-20> direction is high.

[2.6. Detailed Explanation of Two-dimensional Fourier Transform]

A wave such as an acoustic wave, an electromagnetic wave, or a seismic wave can be expressed by the combination of trigonometric waves (sin, cos) having different magnitudes (amplitudes), frequencies, and phases. Likewise, as shown in FIGS. 4A to 4K, the image shown in FIG. 4A can also be expressed by the superposition of the trigonometric waves (FIGS. 43 to 4K) having periodicity in various directions and various frequencies.

The Fourier transform of an acoustic wave or the like is to obtain a Fourier coefficient containing the information of the phase and the amplitude of a trigonometric wave having a certain frequency. Likewise, the Fourier transform of an image is, when the image is converted to a function of brightness in two-dimensional coordinates, to obtain (a) periodicity in a certain direction in the two-dimensional coordinates, and (b) a Fourier coefficient containing the information of the phase and the amplitude of a trigonometric wave having a certain frequency.

Fourier transform $F(k_x, k_y)$ of an image $f(x, y)$ having a size of N×N pixels is represented by the following expression (1). Here, f is the brightness at a coordinate (x, y) and can be obtained by representing a digital image by a bitmap and taking out the information of the brightness at each point from the image data. k is a frequency.

[Numerical expression 1]

$$F(k_x, k_y) = \sum_{y=0}^{y=N-1} \sum_{x=0}^{x=N-1} f(x, y) \exp\left\{-i\frac{2\pi}{N}(k_x x + k_y y)\right\} \quad (1)$$

$$(k_x = 0, 1, \ldots, N-1 \, k_y = 0, 1, \ldots, N-1)$$

A Fourier coefficient $F(k_x, k_y)$ calculated by the expression (1) is generally a complex number and is represented as a point of $F(k_x, k_y)=a+ib$ on a complex plane. On a complex plane, an angle formed between a line connecting an origin to a+ib and the real number axis means the phase of the trigonometric function of the frequency having a cycle from the center of an image to the direction of a coordinate (x, y). $\sqrt{(a^2+b^2)}$ that is the distance from the origin to a+ib represents the amplitude A of the trigonometric function wave.

Figure 5:
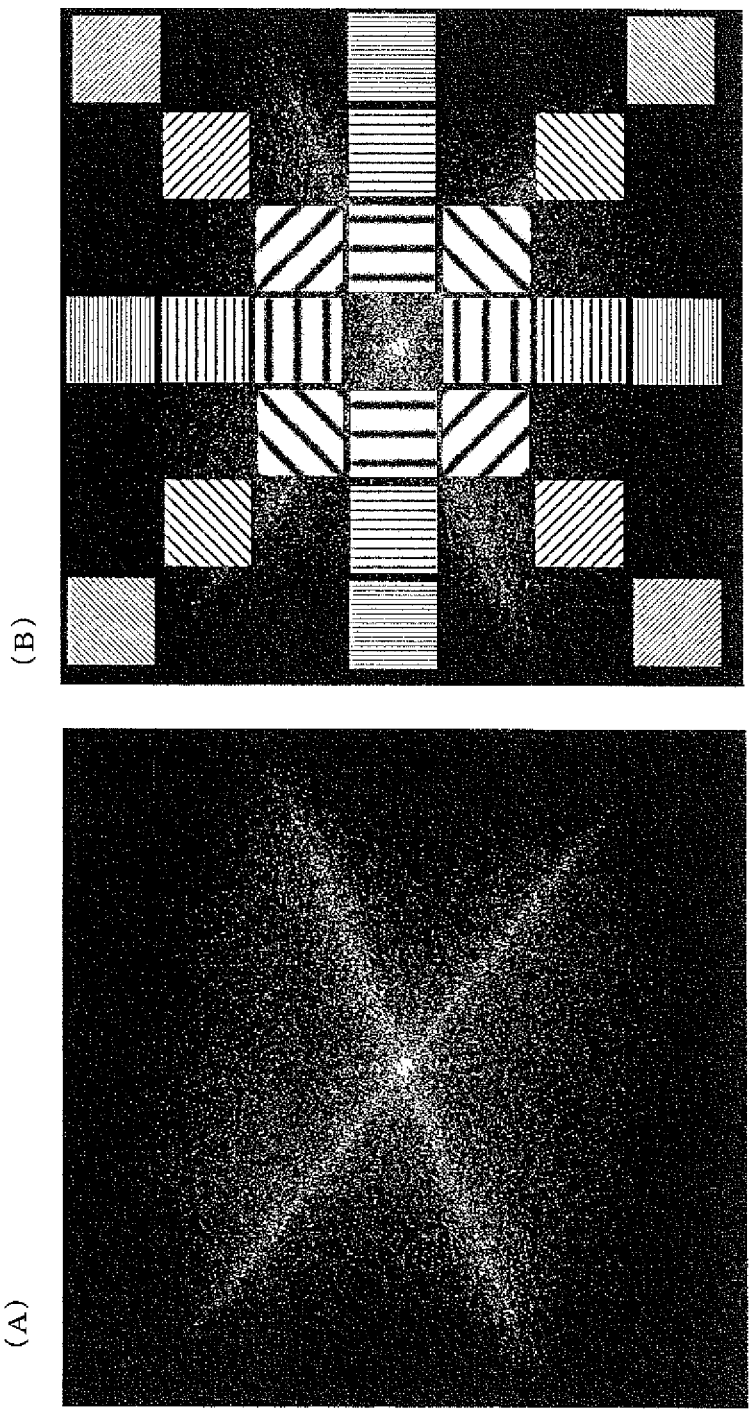
FIG. 5A is a power spectrum obtained by Fourier transform.
FIG. 5B is an example of sinusoidal waveforms at various points.

A power spectrum (FIG. 5A) (spectrum of the amplitude A of a Fourier coefficient) means a spectrum obtained by plotting an amplitude $A=\sqrt{(a^2+b^2)}$ removing the information of the phase on a map representing the magnitude of a frequency and the direction of periodicity. In a power spectrum, a coordinate closer to a center shows a coarser periodicity having a long wavelength. Further, a peak in a surrounding part close to a side means the existence of a fine periodicity having a short wavelength. The quotient obtained by dividing the length of one side of an image by a distance from a center represents the wavelength of the periodicity. Furthermore, the direction from the origin to a coordinate means the direction where the periodicity is repeated. The brightness of each coordinate represents the amplitude of the trigonometric function wave.

For example, when two-dimensional Fourier transform is applied to an image of regularly-arrayed particles or the like and a power spectrum is obtained, a clear spot appears and the contribution of a specific frequency in a specific periodicity direction can be detected remarkably. Meanwhile, two-dimensional Fourier transform can apply not only to an image having regularity but also to the investigation of orientation of a fiber. Further, it can apply to the investigation of the direction and the intensity in the orientation of not only a fiber but also all images allowing the direction and the flow to be observed (Reference Literatures 1 to 3). In such a power spectrum, not a clear spot at a distance from a center but a fuzzy intensity distribution anisotropically and unevenly distributed from the center of the spectrum is observed. When the orientation of a fiber in an image is small, an isotropic power spectrum is obtained. In contrast, when the uniaxial orientation is strong, an ellipse or a peak largely flattening in a direction perpendicular to an orientation direction appears in a power spectrum.

Here, an amplitude A of a power spectrum at each coordinate is represented by a function $A(\theta, r)$ of polar coordinates (FIG. 3B). Here, $\theta$ is an angle formed by a line connecting the center of a spectrum to the coordinate thereof and a line in the horizontal direction. Further, r represents a distance from the center of the spectrum to the coordinate thereof.

With regard to a certain angle $\theta$, $A(\theta, r)$'s are averaged for all of the distance r's, and the $\theta$ dependency $A_{ave.}(\theta)$ of the average amplitude is obtained. On the occasion, $\theta$ is in the range of 0° to 180°. This is because 180° to 360° has a nature to be identical to 0° to 180°. Specifically, after the two-dimensional Fourier transform, the angle of 0° to 180° is equally divided, the amplitude A (r cos $\theta$, r sin $\theta$) of a Fourier coefficient located at a distance r is obtained with regard to each angle $\theta$, and an average value $A_{ave.}(\theta)$ is obtained with regard to r. This is expressed by the expression (2).

[Numerical expression 2]

$$\overline{A(\theta)} = \left(\frac{N}{2} - 1\right)^{-1} \sum_{r=2}^{\frac{N}{2}} A(r\cos\theta, r\sin\theta) \quad (2)$$

As described above, when a largely-flattening ellipse or a peak appears in a power spectrum, $A_{ave.}(\theta)$ comes to be a maximum value or shows a steep peak at a specific $\theta$. $\theta$ at which such a maximum value or a steep peak appears is $\theta$ in a direction perpendicular to the orientation direction in an image before Fourier transform.

As a method for obtaining the intensity of orientation, there is also a method of drawing $A_{ave.}(\theta)$ as a polar coordinate graph, approximating a curve by an ellipse and obtaining a long axis/short axis ratio (Reference Literatures 1 to 3). In the Fourier transform of a basal plane dislocation image obtained in the present invention however, $A_{ave.}(\theta)$ shows a relatively sharp maximum value and is not uniaxial orientation and hence ellipse approximation that is applicable in the case of ordinary fiber orientation cannot be applied.

In the present invention therefore, with regard to $A_{ave.}(\theta)$ obtained by two-dimensional Fourier transform, the orientation of a basal plane dislocation is evaluated by following specific procedures as shown below:

(1) with regard to three crystallographically-equivalent {1-100} planes having different angles in a {0001} plane, X-ray topography by {1-100} plane diffraction is applied and three X-ray topography images of a basal plane dislocation is obtained. From the X-ray topography images, three $A_{ave.}(\theta)$'s corresponding to the {1-100} plane diffraction are obtained, (2) the integrated value $A'_{ave.}(\theta)$ of the three $A_{ave.}(\theta)$'s obtained by Fourier transform is obtained, and (3) when the integrated value $A'_{ave.}(\theta)$ is graphed, in the case where the $A'_{ave.}(\theta)$ shows a clear peak in each of the three $\theta$'s corresponding to the <1-100> direction, the basal plane dislocation is judged to be oriented to the <11-20> direction.

[2.7. Two-dimensional Fourier Transform Software Used]

In the present invention, in order to apply Fourier transform to a basal plane dislocation image, Fiber Orientation Analysis Ver. 8.13 developed by the authors of Reference Literatures 1 to 3 is used. The Fourier transform software carries out the treatment of taking out information of the brightness of each point from image data, applying Fourier transform processing, and obtaining a power spectrum and $A_{ave.}(\theta)$. Detailed procedures are described in Reference Literatures 1 to 3 and Reference URL 1. In order to apply Fourier transform processing to an image with the software, the image is converted to a bitmap beforehand in order to take out the numerical information of brightness. In order to further apply fast Fourier transform, the number of pixels at one side of an image is adjusted beforehand so as to be an integral multiple of four.

Fourier transform processing is decided uniquely and hence any software may be used as long as the software can carry out the same processing. The specific feature of the present software developed for evaluating orientation however is to be able to obtain $A_{ave.}(\theta)$. When $A_{ave.}(\theta)$ cannot be obtained automatically with other software, it is necessary to use a power spectrum obtained by mapping brightness on (x, y) coordinates and apply the same calculation in accordance with the expression (2).

[3. Manufacturing Method of SiC Single Crystal]

An SIC single crystal according to the present invention can be manufactured by various methods and for example can be manufactured by using an SIC seed crystal satisfying the following conditions and growing a new crystal on the surface of the SiC seed crystal:

(1) the SiC seed crystal has a principal growth plane including a plurality of sub-growth planes, (2) a direction (principal direction) having the plural sub-growth planes exists in an arbitrary direction from a {0001} plane uppermost part existing on the principal growth plane of the SIC seed crystal toward the outer periphery of the principal growth plane, and (3) when the sub-growth planes existing from the side of the {0001} plane uppermost part toward the outer periphery along the principal direction are defined as a first sub-growth plane, a second sub-growth plane, -----, and a nth sub-growth plane (n≥2) in sequence, the relationship $\theta_k < \theta_{k+1}$ exists between the offset angle $\theta_k$ of the kth sub-growth plane (1≤k≤n−1) and the offset angle $\theta_{k+1}$ of the (k+1)th sub-growth plane.

Here, a "principal growth plane" means a plane that constitutes a part of exposed planes of an SIC seed crystal and has a component of a crucible center axis/raw material direction in its normal vector 'a'. A "crucible center axis/raw material direction" in a sublimation precipitation method is a direction from an SiC seed crystal toward a raw material and a direction parallel to the center axis of a crucible. In other words, a "crucible center axis/raw material direction" represents a macro growth direction of an SiC single crystal and generally means a direction perpendicular to the bottom plane of an SiC seed crystal or a surface of a seed crystal pedestal to fix the SiC seed crystal.

An "sub-growth plane" means an individual plane constituting a principal growth plane. An sub-growth plane may be either a flat plane or a curved plane.

An "offset angle $\theta$" means an angle formed by a normal vector 'a' of an sub-growth plane and a normal vector 'p' of a {0001} plane of an SiC seed crystal.

A "{0001} plane inclination angle $\beta$" means an angle formed by a vector 'q' of a crucible center axis/raw material direction and a normal vector 'p' of a {0001} plane of an SiC seed crystal.

An "sub-growth plane inclination angle $\alpha$" means an angle formed by a vector 'q' of a crucible center axis/raw material direction and a normal vector 'a' of an sub-growth plane.

An "downstream side in the offset direction" means a side in a direction opposite to the direction of the tip of a vector 'b' formed by projecting a normal vector 'p' of a {0001} plane on an sub-growth plane.

Figure 6:
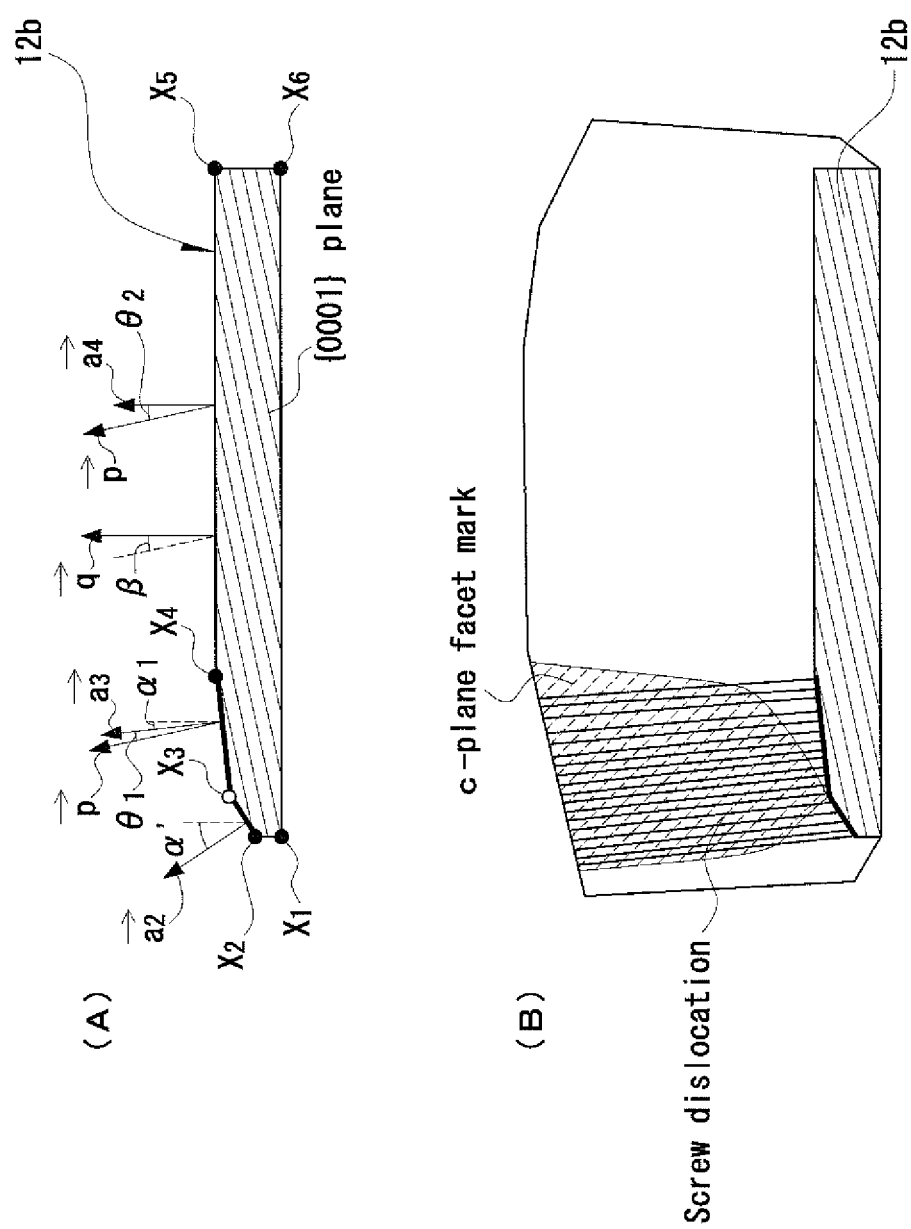
FIG. 6A is a sectional view of an SiC seed crystal.
FIG. 6B is a sectional view of an SiC single crystal grown by using the SiC seed crystal shown in FIG. 6A.

FIG. 6A shows an example of a sectional view of an SiC seed crystal satisfying the above conditions. FIG. 6B shows a sectional view of an SiC single crystal manufactured by using the SiC seed crystal 12b.

In FIG. 6A, the SiC seed crystal 12b has a rectangular cross section and two inclination planes $X_2X_3$ and $X_3X_4$ of different inclination angles at the left top corner. Further, in the SiC seed crystal 12b, the {0001} plane inclination angle $\beta > 0$ and the SiC seed crystal 12b is a so-called offset substrate.

The {0001} plane uppermost part is the point $X_3$. The sub-growth plane inclination angle $\alpha_1$ of the $X_3X_4$ plane is in the relation of $\alpha_1 \leq \beta$. Further, the sub-growth plane inclination angle $\alpha_2$ of the $X_4X_5$ plane is zero. The point $X_5$ is a point having the longest distance from the point $X_3$ and also is the {0001} plane lowermost part in the principal growth plane outer periphery.

With regard to the $X_1X_2$ plane and the $X_5X_6$ plane, the normal vectors thereof are perpendicular to the vector 'g', respectively. Further, the $X_1X_6$ plane is a plane touching a crucible or a seed crystal pedestal (not shown in the figure). Consequently, the principal growth plane includes the $X_2X_3$ plane, the $X_3X_4$ plane, and the $X_4X_5$ plane. Furthermore, the direction from the point $X_3$ of the {0001} plane uppermost part toward the point $X_5$ at the principal growth plane outer periphery is a direction (principal direction) having a plurality of sub-growth planes. In the sub-growth planes existing along the principal direction, the sub-growth plane including the {0001} plane uppermost part is the $X_3X_4$ plane and the plane is the first sub-growth plane. The second sub-growth plane is the $X_4X_5$ plane and has the relation of $\theta_1 < \theta_2$.

The SIC seed crystal 12b scarcely includes a screw dislocation. An SiC single crystal not including a screw dislocation, as described in Patent Literature 1 for example, is obtained by growing on a seed crystal having a growth plane nearly perpendicular to a {0001} plane. Consequently, on the surfaces of the $X_2X_3$ plane and the $X_3X_4$ plane, a screw dislocation generation region (represented with the heavy line in FIG. 6A) is formed.

The screw dislocation generation region is formed by the following methods:

(1) a method of performing a-plane growth at least once using an SiC seed crystal including a screw dislocation, and thereafter exposing a plane nearly perpendicular to a c-axis as a growth plane so that a region including the screw dislocation may remain on the growth plane (screw dislocation remaining method), (2) a method of cutting out an SiC seed crystal exposing a plane inclining at an angle of 8° from a c-plane as a growth plane and forming a grinding plane inclining at an angle of 10° to 20° from the growth plane at the end of the growth plane in the offset direction (grinding method), (3) a method of arraying an SiC seed crystal having a relatively high screw dislocation density (high dislocation density seed crystal) and an SiC seed crystal having a relatively low screw dislocation density (low dislocation density seed crystal) so that the growth planes of these seed crystals may be arranged in an identical plane (bonding method), and (4) a method of forming a retracting part (an inclined plane, a step, a curved face, a cone-shaped dent, a wedge-shaped notch, etc.) for forming a screw dislocation at a part of the growth plane of a seed crystal and preliminarily growing an SiC single crystal at the retracting part (preliminary growing method) (refer to Japanese Patent No. 3764462 and JP-A No. 2010-235390).

As shown in FIG. 6A, by partially changing the offset angle of a principal growth plane of an SiC seed crystal 12b and growing an SiC single crystal by using it, it is possible to suppress the leakage of a screw dislocation or a basal plane edge dislocation and control a screw dislocation density distribution in a grown crystal.

That is, when the offset angle $\theta_1$ of a first sub-growth plane ($X_3X_4$ plane) is reduced relatively, a screw dislocation exposed on the first sub-growth plane or in the vicinity thereof in a seed crystal is succeeded nearly by a grown crystal. As a result, it is possible to surely supply a screw dislocation in a c-plane facet existing on the first sub-growth plane or in the vicinity thereof and thereby a heterogeneous polytype and a differently oriented crystal can be inhibited from being generated in the grown crystal. By further reducing the offset angle $\theta_1$, it is possible to nearly completely inhibit a screw dislocation and a basal plane edge dislocation from leaking to the downstream side in the offset direction in the grown crystal.

In contrast, when the offset angle $\theta_2$ of a second sub-growth plane ($X_4X_5$ plane) increases relatively, the probability that a screw dislocation in a seed crystal exposed on the second sub-growth plane is succeeded by a grown crystal as it is reduces and the screw dislocation is likely to be transformed into a basal plane edge dislocation. A basal plane edge dislocation has a nature of being likely to flow as it is toward the downstream side (point $X_5$ side) in the offset direction. As a result, it is possible to reduce the screw dislocation density in the grown crystal on the second sub-growth plane. Further, a new screw dislocation is likely to be inhibited from being generated.

In an SiC seed crystal 12b further, inclined planes $X_2X_3$ and $X_3X_4$ are formed so that a {0001} plane uppermost part $X_3$ may be inside a principal growth plane. When a crystal is grown by using it therefore, as shown in FIG. 6B, even when a grown crystal expands in a radial direction, a c-plane facet is not likely to be deviated from a high density screw dislocation region. As a result, it is possible to suppress the generation of heterogeneous polytype caused by the temporary reduction of a screw dislocation density.

Further, when an SiC seed crystal 12b of such a shape is cut out from a single crystal grown by using a plane nearly perpendicular to a c-plane as a growth plane and an SiC single crystal is grown by using it, a basal plane dislocation remaining in a grown crystal is likely to be oriented to the <11-20> direction. Further, it is possible to obtain an SiC single crystal including a region not substantially including a stacking fault. This is presumably because, a dislocation coming to be an origin of a basal plane dislocation and a screw dislocation transforming into a stacking fault are few in the seed crystal itself, a screw dislocation scarcely leaks from a screw dislocation generation region formed at a seed crystal end, and the intertwinement of a basal plane dislocation and a screw dislocation does not occur.

[4. SiC Wafer]

An SiC wafer according to the present invention includes a wafer cut out in nearly parallel to a {0001} plane from an SiC single crystal according to the present invention.

The surface of a wafer is not necessarily completely parallel to a {0001} plane and may incline from a {0001} plane to some extent. The allowable degree of inclination (offset angle) varies in accordance with the application of a wafer but usually about 0° to 10°.

An obtained wafer is used for various applications as it is or in the state of forming a thin film on a surface. When a semiconductor device is manufactured by using a wafer for example, an epitaxial film is formed on a wafer surface. As an epitaxial film, specifically SiC, nitride such as GaN, or the like is used.

[5. Semiconductor Device]

A semiconductor device according to the present invention includes a device manufactured by using an SiC wafer according to the present invention. As a semiconductor device, specifically there is (a) an LED, or (b) a diode or a transistor for a power device.

[6. Effect of SiC Single Crystal, SiC Wafer, and Semiconductor Device]

In the case where an SiC single crystal is grown on a c-plane, by using a seed crystal in which the offset angle of a surface satisfies specific conditions, it is possible to obtain the SiC single crystal having a highly-linear basal plane dislocation highly oriented to a stable <11-20> direction.

When a wafer is cut out in nearly parallel to a {0001} plane from such an SiC single crystal, the number of basal plane dislocations exposed on a wafer surface reduces relatively. As a result, even when an SiC single crystal is grown by using such a wafer as a seed crystal or an epitaxial film is formed on a wafer surface, the number of dislocations succeeded by a grown crystal or an epitaxial film also reduces.

Further, when a semiconductor device is manufactured by using such an SiC single crystal, it is possible to suppress the generation of a stacking fault caused by the decomposition of a curved basal plane dislocation during use and the degradation of device characteristics caused by the generation of the stacking fault.

EXAMPLES

Example 1

[1. Preparation of Specimen]

A step of growing an SiC single crystal on a growth plane nearly perpendicular to a c-plane, a step of taking out a seed crystal having a growth plane nearly perpendicular to both the last growth plane and the c-plane from the obtained SiC single crystal, and a step of growing an SiC single crystal again by using the seed crystal were repeated. A c-plane offset substrate was taken out from the obtained SiC single crystal and processed to the shape shown in FIG. 6A. A screw dislocation generation region was formed on the $X_2X_3$ plane and the $X_3X_4$ plane on the growth plane. By using it, an SiC single crystal was manufactured by a sublimation repreciptation method. The obtained single crystal was cut in nearly parallel (offset angle: 8°) to a {0001} plane, flattening treatment and damaged layer removing treatment were applied to the surface, and thereby a wafer 500 μm in thickness was obtained. The damaged layer was removed by CMP treatment.

[2. Test Method]
[2.1. X-Ray Topography Measurement]

With regard to the three planes of a (−1010) plane, a (1-100) plane, and a (01-10) plane, those being crystallographically equivalent and having different plane orientations forming angles of 60° with each other, {1-100} plane diffraction images were measured and X-ray topography images were obtained on photosensitive films. In the obtained three X-ray topography images, basal plane dislocation images rectilinearly extending in the {0001} plane were observed.

The measurement conditions of the X-ray topography are as follows:
X-ray tube: Mo target,
Voltage: 60 kV,
Current: 300 mA,
{1-100} plane diffraction (2θ: 15.318°),
Width of second slit: 2 mm,
Scanning speed: 2 mm/sec.,
Number of Scans: 300 times.

[2.2. Preprocessing of Image]

The X-ray topography images were read with a scanner and thereby digitized. The scanning condition was a gray scale and the resolution was about 1,000 pixels/cm. A square measurement region where the length L of each side is 10 to 20 mm was taken out from the vicinity of the center of each of the digitized X-ray topography images. The gray level was corrected so that a basal plane dislocation site may be darkest and a non-dislocation site may be brightest. The resolution of an image was dropped so that the number of the pixels on one side of the image may be 512 pixels and the image was transformed into an image file of a bitmap format.

[2.3. Orientation Measurement by Fourier Transform]

The preprocessed three digital images were processed by Fiber Orientation Analysis Ver. 8.13 as Fourier transform software and a power spectrum and an $A_{ave.}(\theta)$ were obtained for each of the three digital images. Further, the $A_{ave.}(\theta)$'s obtained for the three images were integrated. Further, by using the integrated value $A'_{ave.}(\theta)$, $A'_{ave.}(\theta_i)/B.G.(\theta_i)$ ratios at three $\theta_i$'s (i=1 to 3) corresponding to the <1-100> direction and an orientation intensity B were obtained.

[3. Result]

Figure 7:
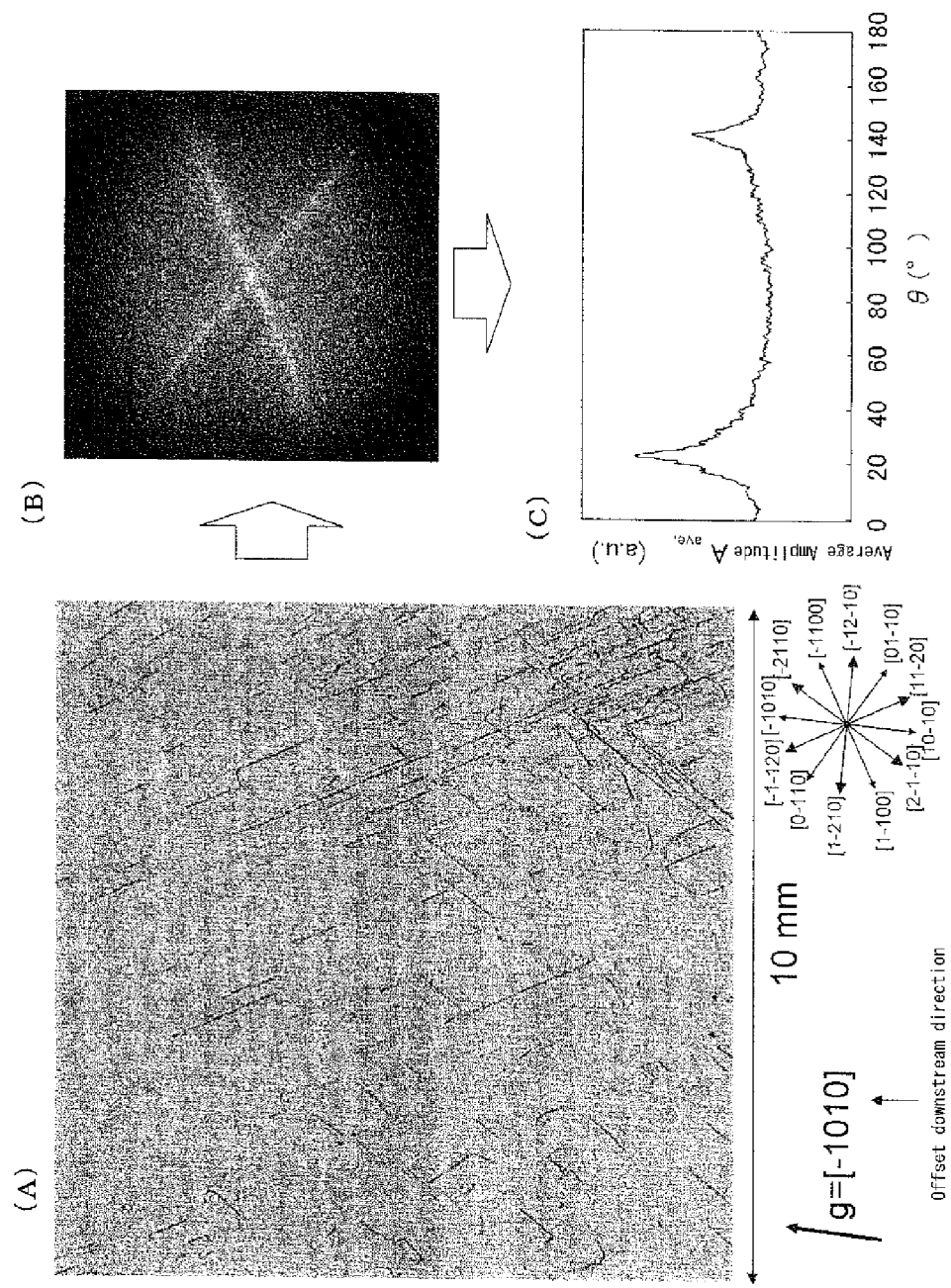
FIG. 7A is an image ((-1010) plane diffraction) in a measurement region of 10-mm square extracted from the center of an X-ray topography image of a single crystal obtained in Example 1.
FIG. 7B is a power spectrum (spectrum of the amplitude A of a Fourier coefficient) obtained by applying Fourier transform to the X-ray topography image in FIG. 7A.
FIG. 7C is a graph showing the angle θ dependency of an average amplitude $A_{ave.}$ obtained from the power spectrum in FIG. 713.
Figure 8:
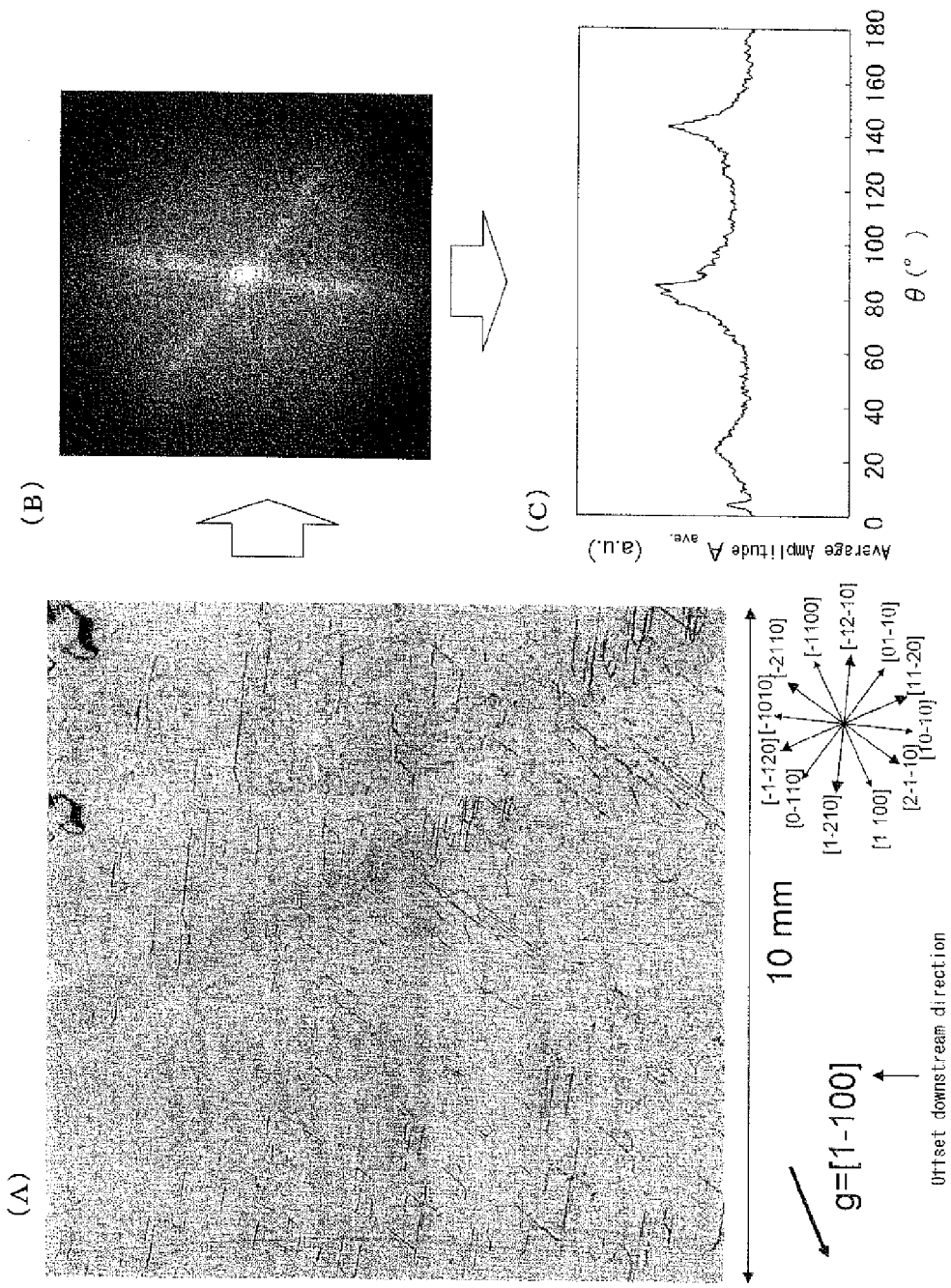
FIG. 8A is an image (1-100) plane diffraction) in a measurement region of 10-mm square extracted from the center of an X-ray topography image of a single crystal obtained in Example 1.
FIG. 8B is a power spectrum obtained by applying Fourier transform to the X-ray topography image in FIG. 8A.
FIG. 8C is a graph showing the angle θ dependency of an average amplitude $A_{ave.}$ obtained from the power spectrum in FIG. 8B.
Figure 9:
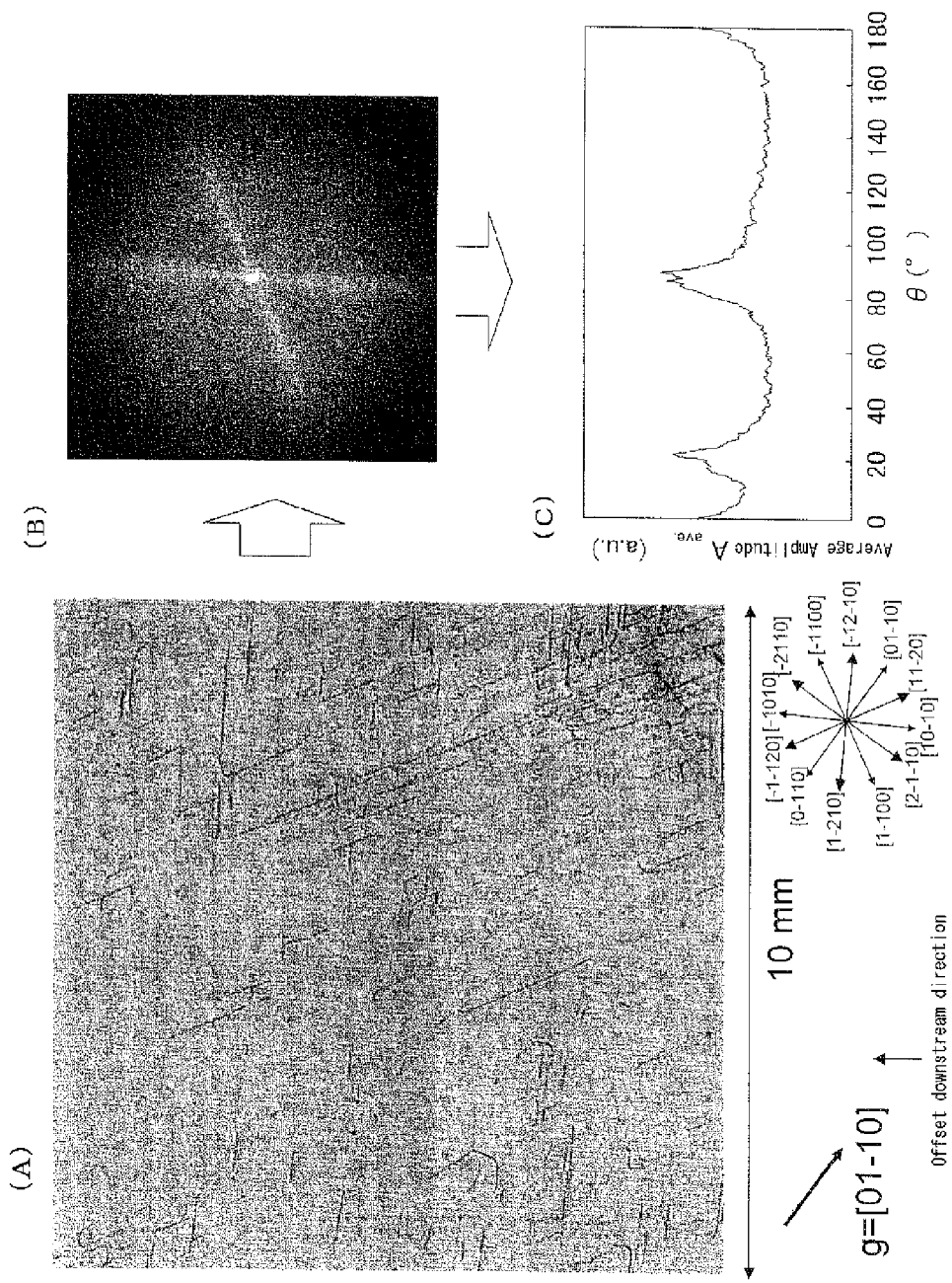
FIG. 9A is an image ((01-10) plane diffraction) in a measurement region of 10-mm square extracted from the center of an X-ray topography image of a single crystal obtained in Example 1.
FIG. 9B is a power spectrum obtained by applying Fourier transform to the X-ray topography image in FIG. 9A.
FIG. 9C is a graph showing the angle θ dependency of an average amplitude $A_{ave.}$ obtained from the power spectrum in FIG. 9B.

FIGS. 7A to 9C show images in measurement regions of 10-mm square extracted from the centers of the X-ray topography images of the single crystal obtained in Example 1, power spectra thereof, and $A_{ave.}(\theta)$'s, respectively. FIGS. 7A to 7C correspond to (−1010) plane diffraction, FIGS. 8A to 8C correspond to (1-100) plane diffraction, and FIGS. 9A to 9C correspond to (01-10) plane diffraction, respectively. The upper direction of the figures is the offset downstream direction and is a direction inclining from the [−1010] direction to the [−1-120] direction at an angle of several degrees. From FIGS. 7A to 9C, it is understood that clear lines are recognized in the directions corresponding to the <1-100> direction in the power spectra.

Figure 10:
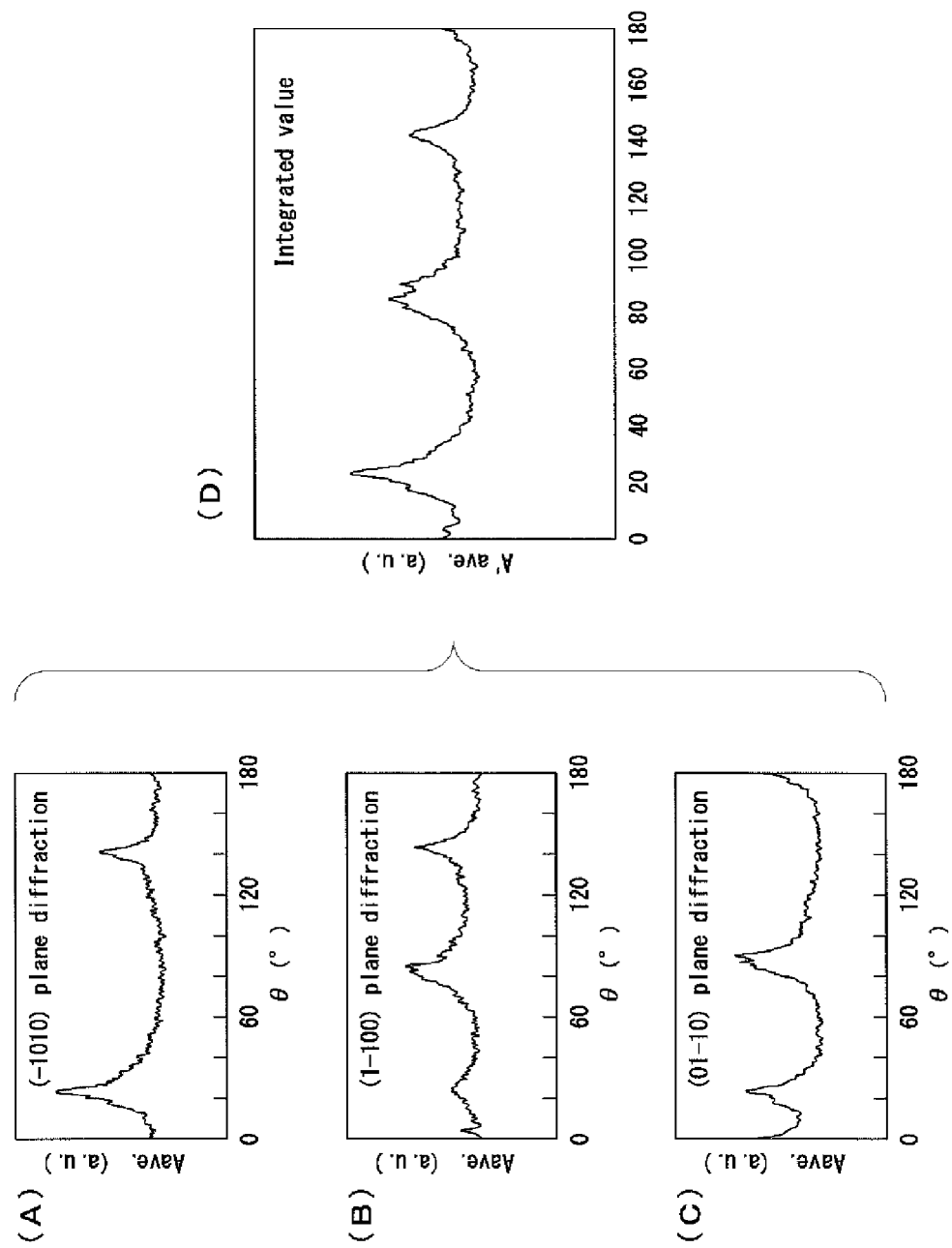
FIGS. 10A to 10C are graphs showing the angle θ dependency of average amplitude $A_{ave.}$'s shown in FIGS. 7C, 8C, and 9C, respectively.
FIG. 10D is the integrated value $A'_{ave.}$ of FIGS. 10A to 10C.

FIG. 10D shows the integrated value $A'_{ave.}(\theta)$ of the three $A'_{ave.}(\theta)$'s (FIGS. 10A to 10C) obtained in FIGS. 7A to 9C.

Figure 11:
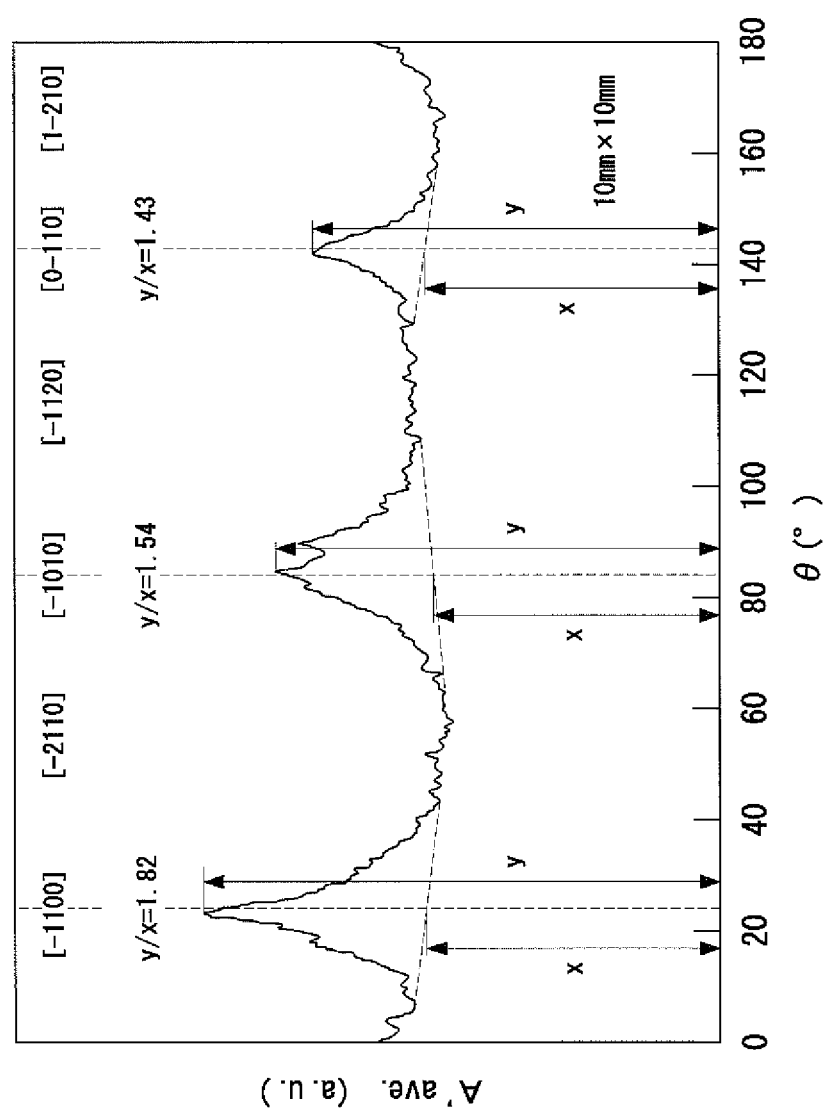
FIG. 11 is a graph showing an example of a method for computing an $A'_{ave.}(\theta_i)/B.G.(\theta_i)$ ratio from an integrated value $A'_{ave.}(\theta)$.

Further, FIG. 11 shows an example of a method for computing $A'_{ave.}(\theta_i)/B.G.(\theta_i)$ ratios from the integrated value $A'_{ave.}(\theta)$.

From FIG. 10D, it is understood that a single crystal obtained in Example 1 shows clear peaks at the three θ's corresponding to the <1-100> direction. As shown in FIG. 11, the $A'_{ave.}(\theta_i)/B.G.(\theta_i)$ ratio is 1.82 at $\theta_i$ corresponding to the [−1100] direction. The $A'_{ave.}(\theta_i)/B.G.(\theta_i)$ ratio is 1.54 at $\theta_i$ corresponding to the [−1010] direction. Further, the $A'_{ave.}(\theta_i)/B.G.(\theta_i)$ ratio is 1.43 at $\theta_i$ corresponding to the [0-110] direction. From the results, it is found that the basal plane dislocation is oriented to three <11-20> directions. Further, the orientation intensity B that is the average thereof is 1.60. Furthermore, the peak caused by the basal plane dislocation in the [−1-120] direction that is the <11-20> direction forming the smallest angle with the offset downstream direction is the largest.

Similar treatment was applied to a 12-mm square region, a 14-mm square region, a 16-mm square region, an 18-mm square region, and a 20-mm square region and integrated values $A'_{ave.}(\theta)$'s were obtained, respectively. From each of the obtained integrated values $A'_{ave.}(\theta)$'s, $A'_{ave.}(\theta_i)/B.G.(\theta_i)$ ratios at three $\theta_i$'s (i=1 to 3) corresponding to the <1-100> direction and an orientation intensity B were obtained. The results are shown in Table 1.

In the case of Example 1, regardless of the size of the measurement region, clear peaks are shown at the three $\theta_i$'s corresponding to the <1-100> direction. Further, as the measurement region increases, the $A'_{ave.}(\theta_i)/B.G.(\theta_i)$ ratios decrease. This is because a basal plane dislocation comes to be relatively unclear when a measurement region increases.

TABLE 1

| | $A'_{ave.}(\theta_i)/B.G.(\theta_i)$ ratio | | | |
|---|---|---|---|---|
| L (mm) | $\theta_1$[−1100] | $\theta_2$[−1010] | $\theta_3$[0-110] | B |
| 10 | 1.82 | 1.54 | 1.43 | 1.60 |
| 12 | 1.61 | 1.50 | 1.39 | 1.50 |
| 14 | 1.53 | 1.39 | 1.37 | 1.43 |
| 16 | 1.34 | 1.34 | 1.41 | 1.37 |
| 18 | 1.22 | 1.27 | 1.26 | 1.25 |
| 20 | 1.12 | 1.29 | 1.13 | 1.18 |

L (mm): Length of one side of measurement reasion
B: Orientation intensity

An X-ray topography image was divided into a plurality of 10-mm square regions and the orientation intensities were obtained likewise. As a result, high orientation intensities of 1.5 or more are obtained in the area ratios of 90% or more including the center region. In contrast, an orientation intensity in a screw dislocation generation region shows a low value.

Figure 12:
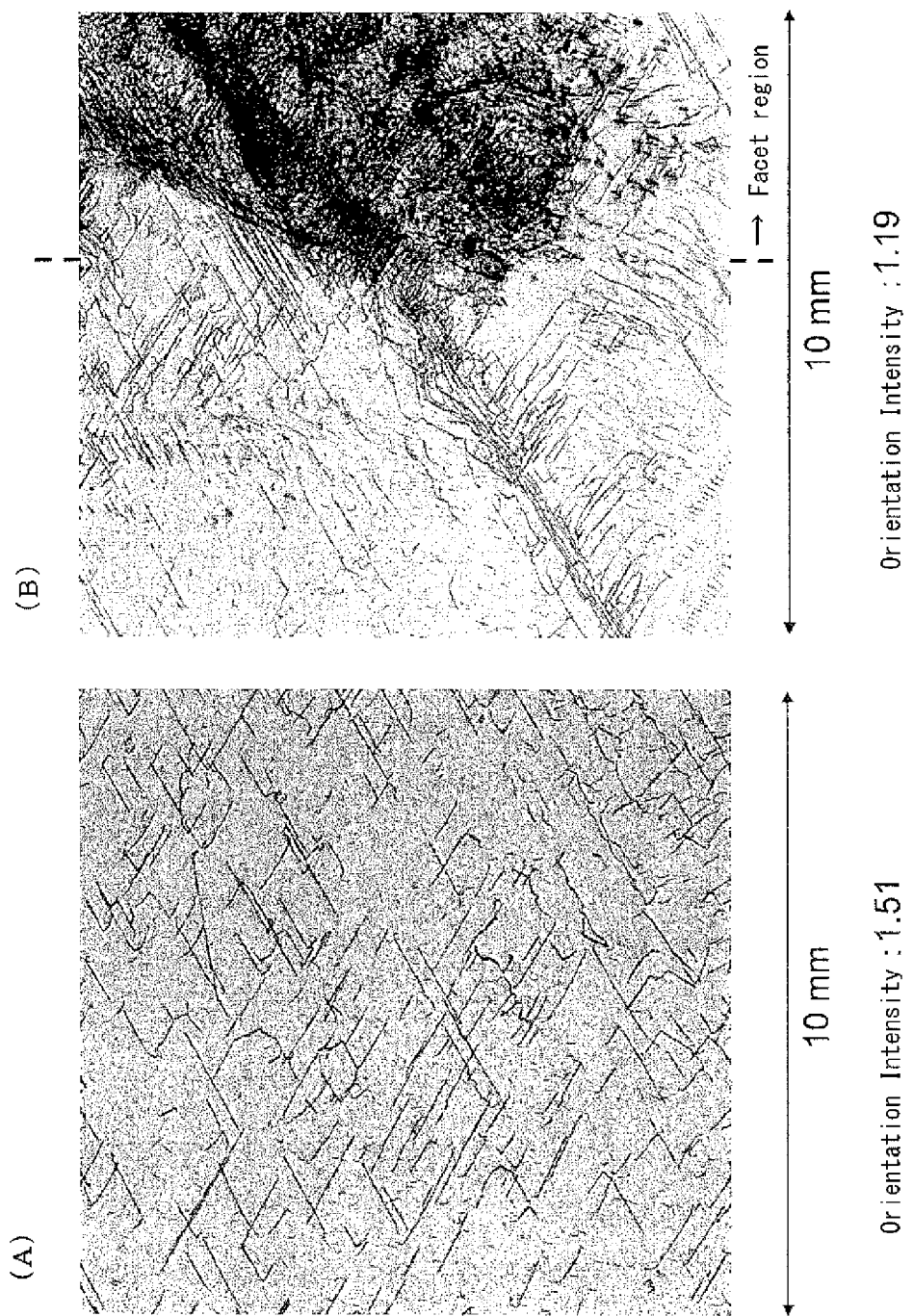
FIG. 12A is an X-ray topography image and an orientation intensity at a region apart from a facet.
FIG. 12B is an X-ray topography image and an orientation intensity at a region in the vicinity of a facet.

FIG. 12A shows an X-ray topography image and an orientation intensity in a region apart from a facet. Further, FIG. 12B shows an X-ray topography image and an orientation intensity in a region adjacent to a facet. From FIGS. 12A and 12B, it is understood that the linearity and orientation of a basal plane dislocation deteriorate in the vicinity of a facet.

Comparative Example 1

[1. Preparation of Specimen]

A step of growing an SiC single crystal on a growth plane nearly perpendicular to a c-plane, a step of taking out a seed crystal having a growth plane nearly perpendicular to both the last growth plane and the c-plane from the obtained SiC single crystal, and a step of growing an SiC single crystal again by using the seed crystal were repeated. A c-plane offset substrate was taken out from the obtained SiC single crystal. Here, such processing as shown in FIG. 6A (processing to make the offset angle of the $X_3X_4$ plane smaller than that of the $X_4X_5$ plane) was not applied. Further, a screw dislocation generation region was formed at the $X_2X_3$ plane and a certain part from $X_3$ to the offset downstream side (the part ranging to $X_4$ in FIG. 6A). An SiC single crystal was manufactured by using the c-plane offset substrate. Here, the X-ray topograph of a crystal described in Non-patent Literature 5 is an X-ray topography image that can be obtained by the present inventors and it is estimated that the orientation and linearity of the basal plane dislocation image are the highest and the crystal has high quality. A wafer was manufactured from the obtained single crystal following the same procedures as Example 1.

[2. Test Method]

Following the same procedures as Example 1, $A'_{ave.}(\theta_i)/B.G.(\theta_i)$ ratios at three $\theta_i$'s corresponding to the <1-100> direction and an orientation intensity B were obtained.

[3. Result]

Figure 13:
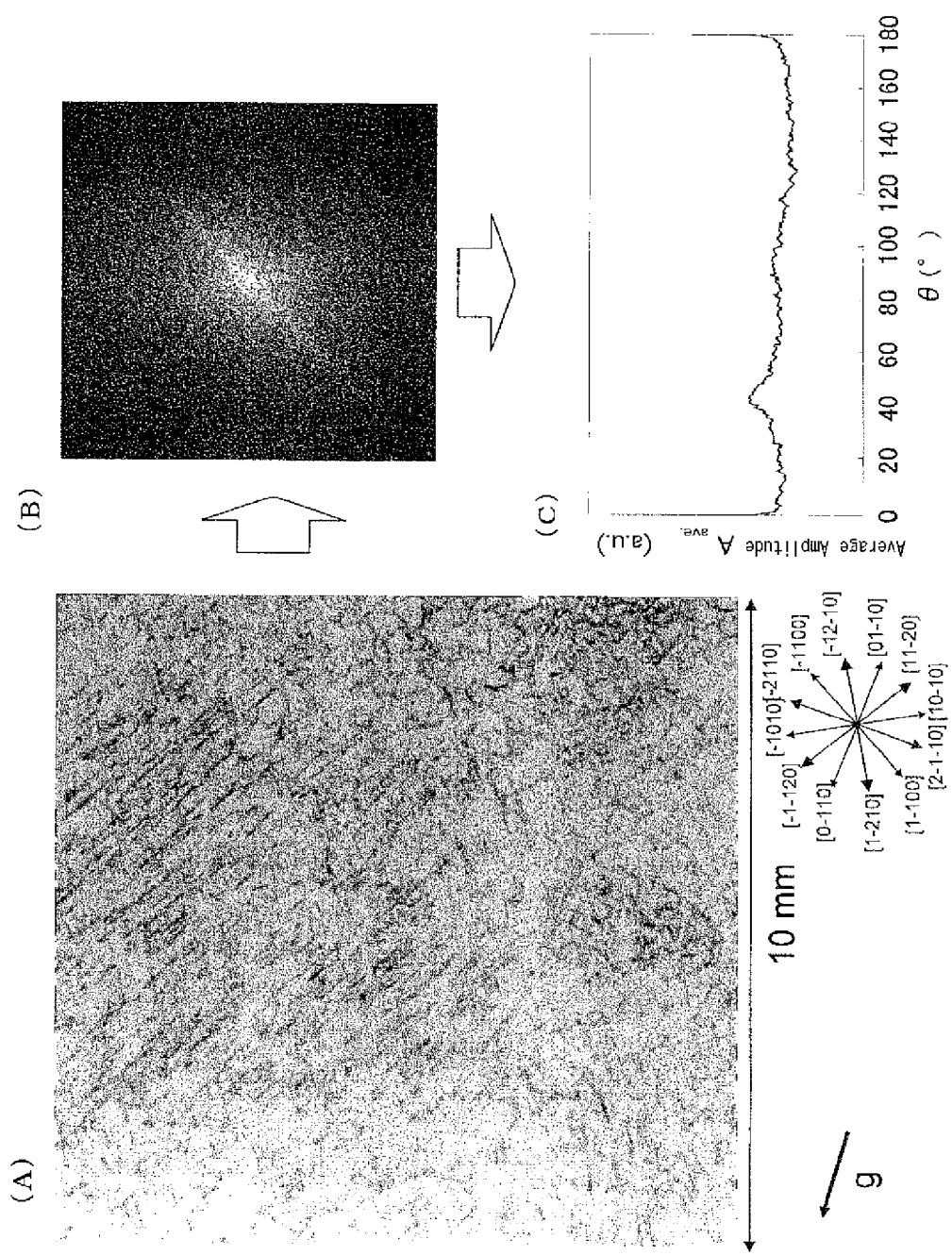
FIG. 13A is an image ((-1010) plane diffraction) in a measurement region of 10-mm square extracted from an X-ray topography image of a single crystal obtained in Comparative Example 1.
FIG. 13B is a power spectrum obtained by applying Fourier transform to the X-ray topography image in FIG. 13A.
FIG. 13C is a graph showing the angle θ dependency of an average amplitude $A_{ave.}$ obtained from the power spectrum in FIG. 13B.

FIGS. 13A to 13C show the image of a 10-mm square measurement region at a part where the orientation intensity of a basal plane dislocation is resultantly highest in the measured X-ray topography images of a single crystal obtained in Comparative Example 1, the power spectrum thereof, and $A_{ave.}(\theta)$. Here, FIGS. 13A to 13C correspond to (0-110) plane diffraction. As shown in FIG. 13B, in the power spectrum, no clear line is recognized in the directions corresponding to the <1-100> direction.

The integrated value $A'_{ave.}(\theta)$ shows peaks at two $\theta_i$'s of the [-1100] direction and the [0-110] direction in three $\theta_i$'s (i=1 to 3) corresponding to the <1-100> direction. The $A'_{ave.}(\theta_i)/B.G.(\theta_i)$ ratios, however, are relatively small. Further, a clear peak is not shown at $\theta_i$ corresponding to the [-1010] direction. $A'_{ave.}(\theta_i)/B.G.(\theta_i)$ ratio is 1.18 at $\theta_i$ corresponding to the [-1100] direction. $A'_{ave.}(\theta_i)/B.G.(\theta_i)$ ratio is 1.03 at $\theta_i$ corresponding to the [-1010] direction. Further, $A'_{ave.}(\theta_i)/B.G.(\theta_i)$ ratio is 1.27 at $\theta_i$ corresponding to the [0-110] direction. From the results, it is found that the orientation of a basal plane dislocation in the <11-20> direction is low. Further, the orientation strength B that is the average thereof is 1.16.

Similar processing was applied to a 12-mm square region, a 14-mm square region, a 16-mm square region, an 18-mm square region, and a 20-mm square region and integrated value $A'_{ave.}(\theta)$'s were obtained, respectively. From each of the obtained integrated values $A'_{ave.}(\theta)$'s, $A'_{ave.}(\theta_i)/B.G.(\theta_i)$ ratios at three $\theta_i$'s corresponding to the <1-100> direction and an orientation intensity B were obtained. The results are shown in Table 2.

In the case of Comparative Example 1, regardless of the size of the measurement region, no clear peak is shown at least one $\theta_i$ in the three $\theta_i$'s corresponding to the <1-100> direction. Further, as the measurement region increases, the $A'_{ave.}(\theta_i)/B.G.(\theta_i)$ ratios decrease. As a matter of course, the orientation intensity in another partition region is smaller than those when they are compared by standardizing the size of the measurement regions.

TABLE 2

| | $A'_{ave.}(\theta_i)/B.G.(\theta_i)$ ratio | | | |
|---|---|---|---|---|
| L (mm) | $\theta_1$[-1100] | $\theta_2$[-1010] | $\theta_3$[0-110] | B |
| 10 | 1.18 | 1.03 | 1.27 | 1.16 |
| 12 | 1.11 | 1.06 | 1.13 | 1.10 |
| 14 | 1.27 | 1.06 | 1.22 | 1.19 |

TABLE 2-continued

| | $A'_{ave.}(\theta_i)/B.G.(\theta_i)$ ratio | | | |
|---|---|---|---|---|
| L (mm) | $\theta_1$[-1100] | $\theta_2$[-1010] | $\theta_3$[0-110] | B |
| 16 | 1.18 | 1.04 | 1.00 | 1.07 |
| 18 | 1.10 | 1.00 | 1.08 | 1.06 |
| 20 | 1.05 | 1.03 | 1.08 | 1.05 |

L (mm): Length of one side of measurement reasion
B: Orientation intensity

Figure 14:
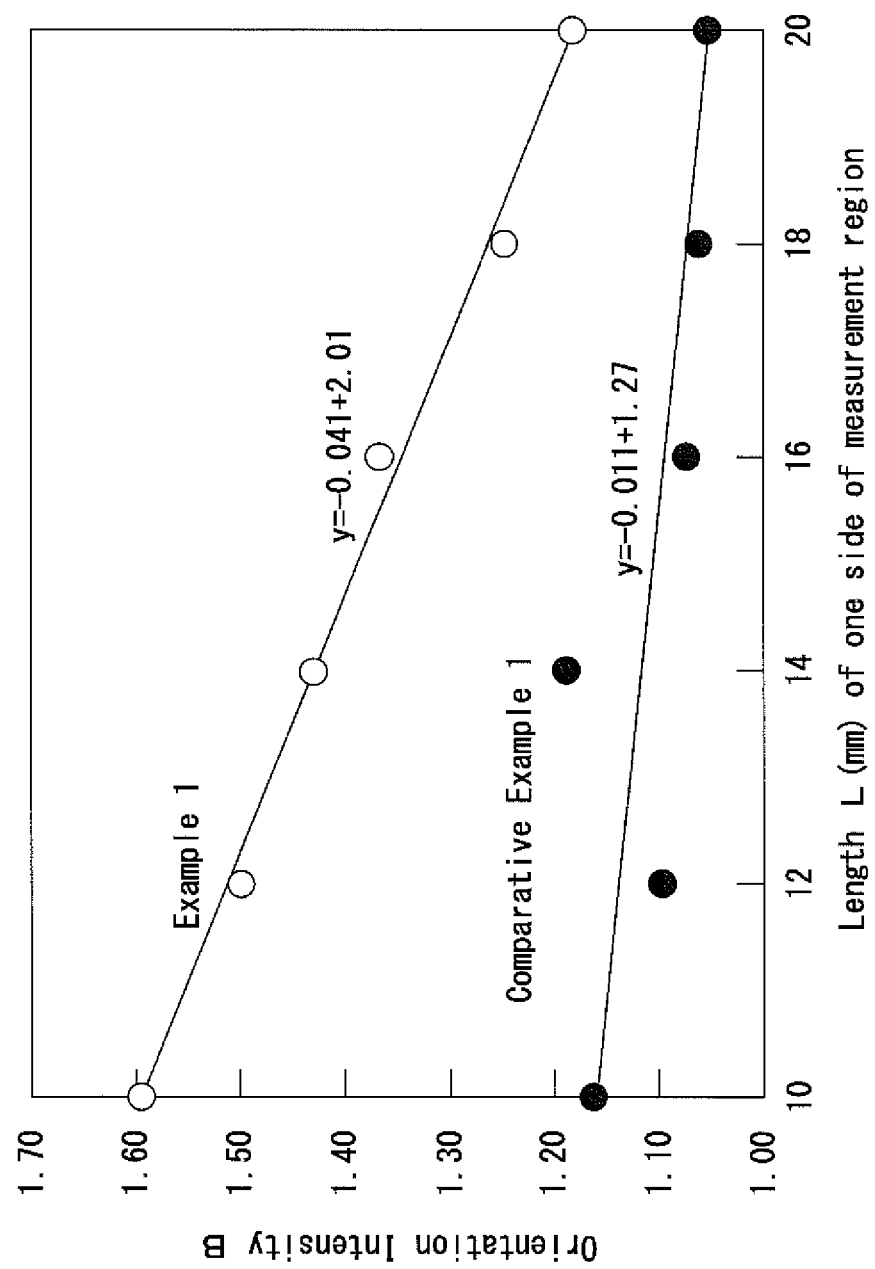
FIG. 14 is a graph showing the measurement region size dependency of the orientation intensities B of single crystals obtained in Example 1 and Comparative Example 1.
Figure 15:
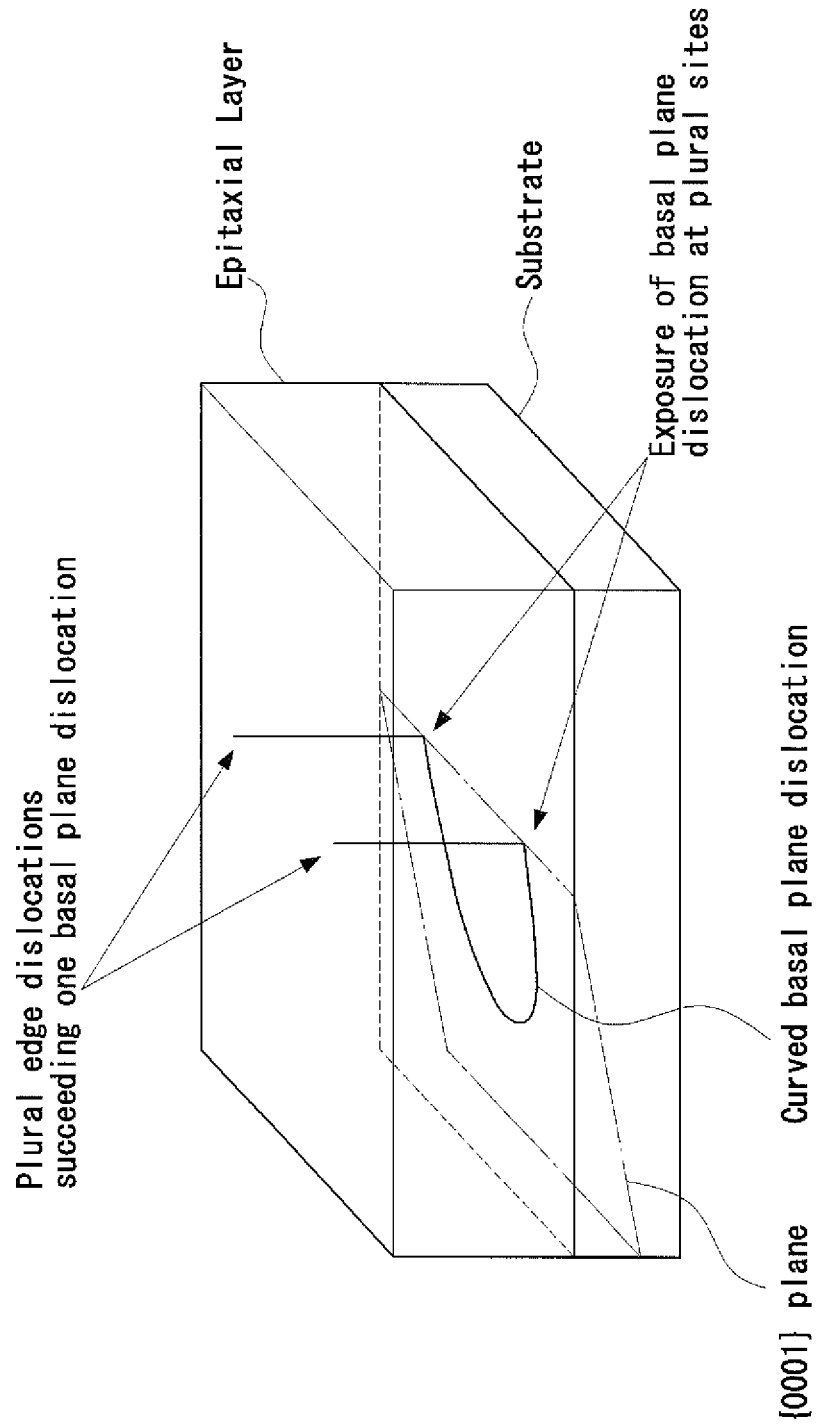
FIG. 15 is a schematic illustration showing the state of generating a plurality of edge dislocations from a curved basal plane dislocation.
Figure 16:
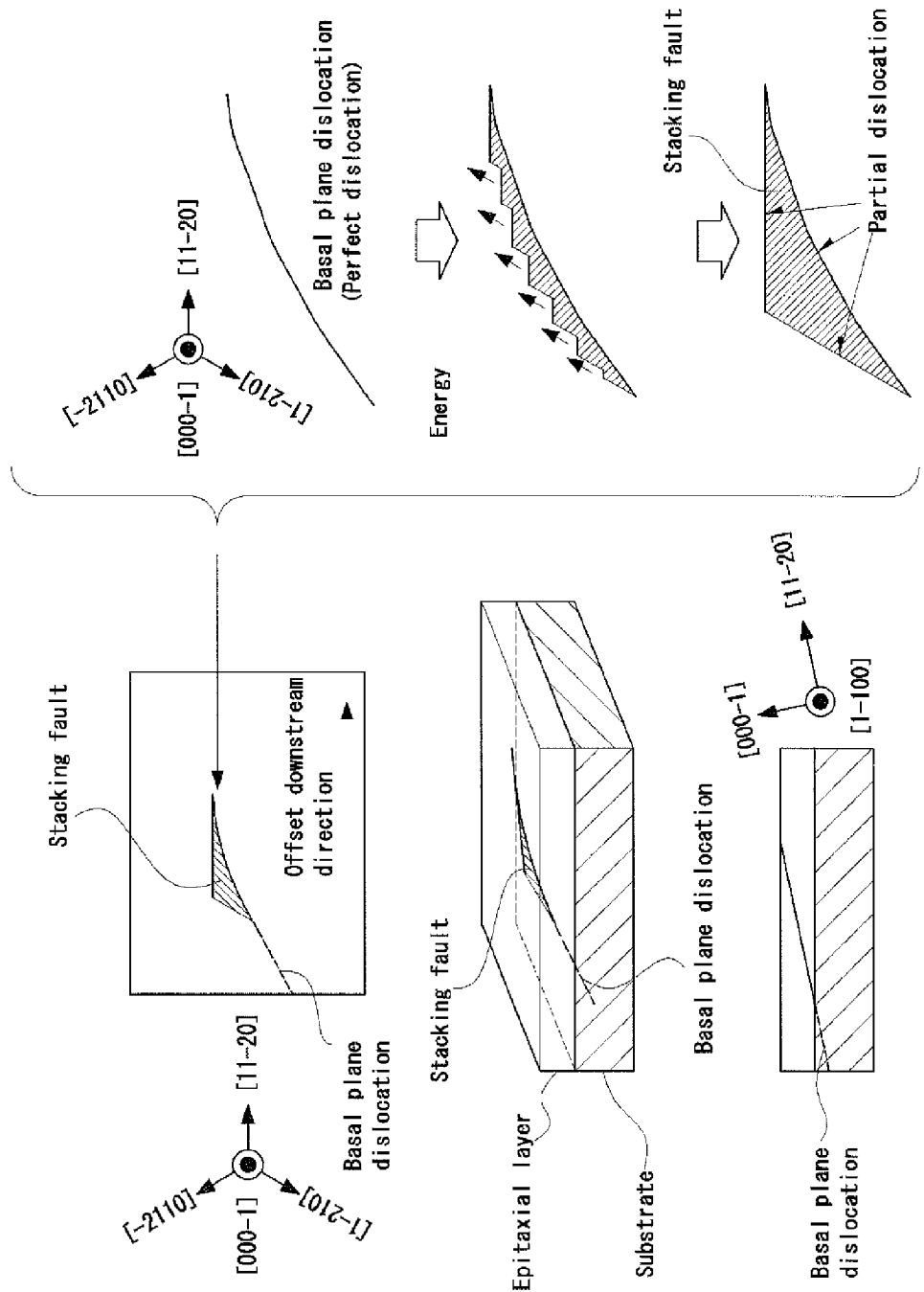
FIG. 16 is a schematic illustration showing the state of generating a stacking fault due to the decomposition of a basal plane dislocation into partial dislocations.
Figure 17:
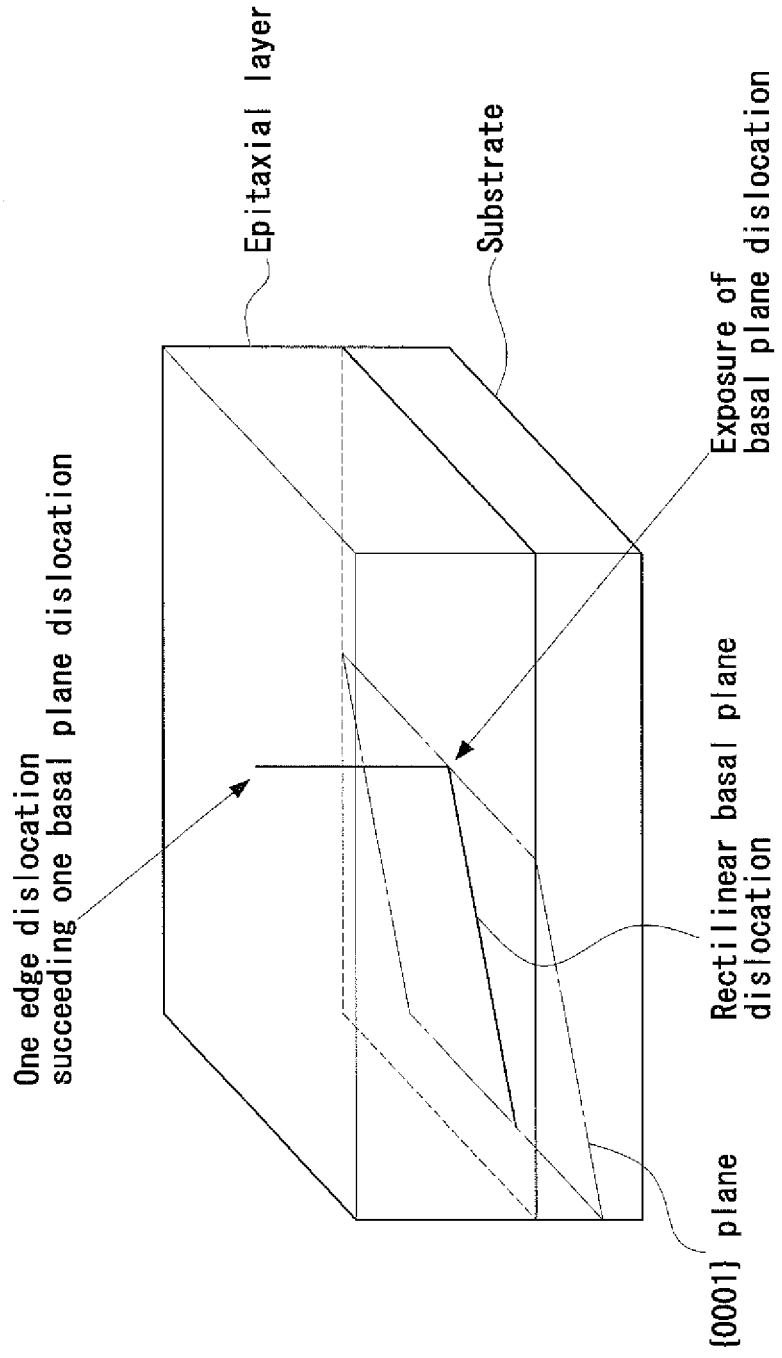
FIG. 17 is a schematic illustration showing the state of generating an edge dislocation from a rectilinear basal plane dislocation.
Figure 18:
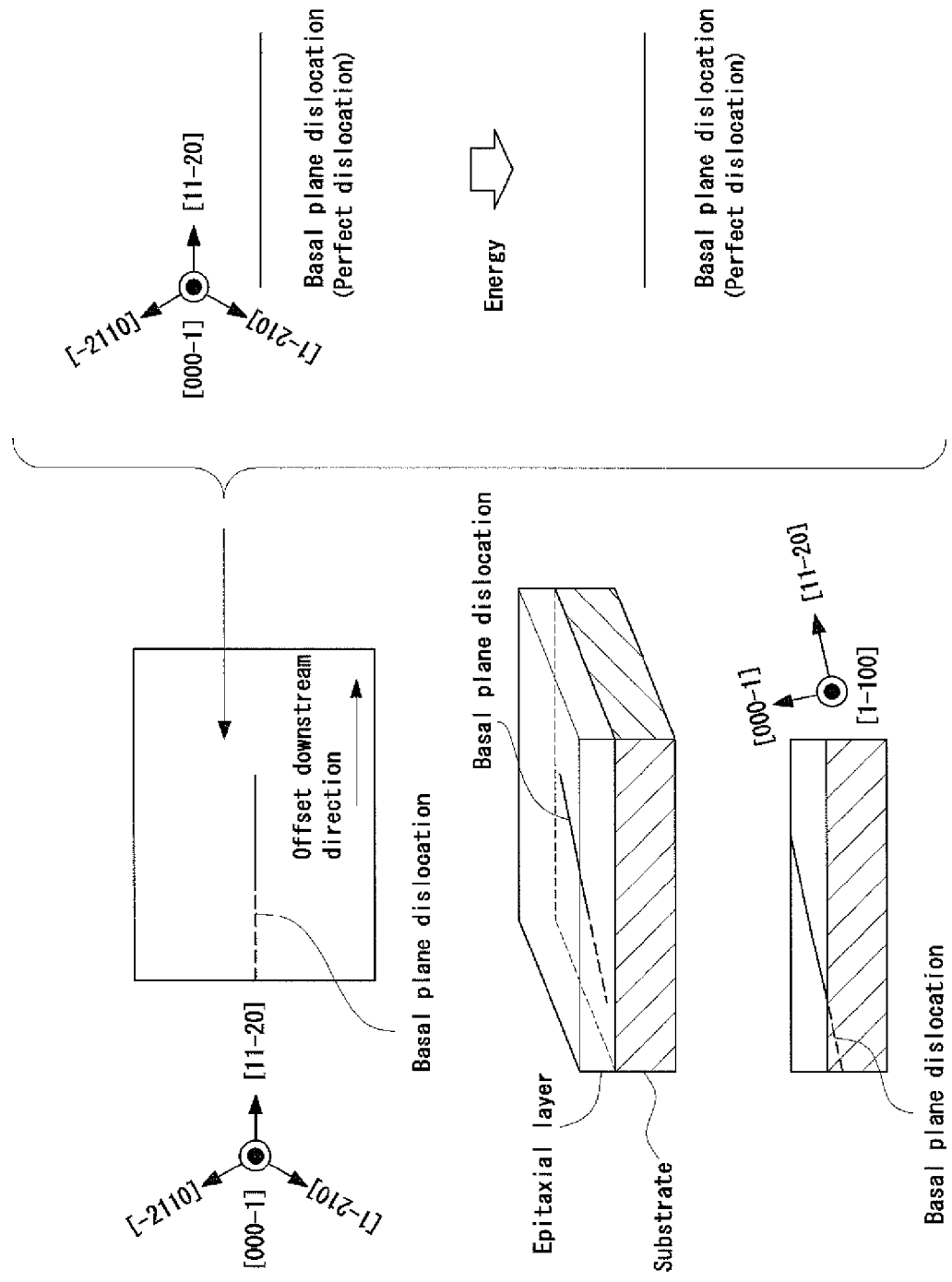
FIG. 18 is a schematic illustration of a basal plane dislocation stabilized in the <11-20> direction.

FIG. 14 shows the measurement region size dependency of orientation intensities B in single crystals obtained in Example 1 and Comparative Example 1. It is found that, by representing the length L (mm) of one side of a measurement region by x-axis, representing an orientation intensity B by y-axis, and plotting the orientation intensity B at the size of each measurement region, the relationship between L and can be approximated by a straight line in each of Example 1 and Comparative Example 1. In the case of Example I, the linear approximate expression of y=-0.041x+2.01 is obtained. Further, in the case of Comparative Example 1, the linear approximate expression of y=-0.011x+1.27 is obtained. It is estimated that the reason why an orientation intensity B decreases as a measurement region increases is that a basal plane dislocation in an X-ray topography image comes to be unclear as the measurement region increases.

Although the embodiments according to the present invention have heretofore been explained in detail, the present invention is not limited at all by the embodiments and can be modified variously within the range not deviating from the gist of the present invention.

An SiC single crystal according to the present invention can be used as a semiconductor material of an ultralow power-loss power device.

What is claimed is:

1. An SiC single crystal having the following configuration:
   (1) the SiC single crystal has at least one orientation region where a basal plane dislocation has a high linearity and is oriented to three crystallographically-equivalent <11-20> directions; and
   (2) the orientation region being a region determined via the following procedures,
      (a) a wafer with the surface nearly parallel to a {0001} plane is cut out from the SiC single crystal,
      (b) X-ray topography measurement by transmission arrangement is applied to the wafer and X-ray topography images corresponding to three crystallographically-equivalent {1-100} plane diffractions are photographed,
      (c) each of the three X-ray topography images is transformed into a digital image obtained by quantifying the brightness of each point in the image and each of the three digital images is comparted into a square measurement region where the length L of each side is 10±0.1 mm,
      (d) two-dimensional Fourier transform processing is applied to each of the digital images in the three measurement regions corresponding to an identical region on the wafer and a power spectrum (spectrum of the amplitude A of a Fourier coefficient) is obtained,
      (e) each of the three power spectra is converted into a polar coordinate function and a function $A_{ave.}(\theta)$ of angle (direction) dependency of an average amplitude A is obtained (0°≤θ≤180°), (f) an integrated value $A'_{ave.}(\theta)$ of the three $A_{ave.}(\theta)$'s is shown in a graph (x-axis: $\theta$, y-axis: $A'_{ave.}$) and the ratio of a peak value $A'_{ave.}(\theta_i)$ to a background B.G.$(\theta_i)$ ($=A'_{ave.}(\theta_i)/B.G.(\theta_i)$ ratio) is computed for each of three $\theta_i$'s ($i=1$ to 3) corresponding to the three <1-100> directions, and (g) when all of the three $A'_{ave.}(\theta_i)/B.G.(\theta_i)$ ratios are 1.1 or more, the region of the wafer corresponding to the three measurement regions is determined to be an "orientation region".

2. The SiC single crystal according to claim 1, wherein the at least one orientation region is in a region where a facet mark is excluded in the SiC single crystal.

3. The SiC single crystal according to claim 1, wherein the at least one orientation region is nearly in the center of the SiC single crystal.

4. The SiC single crystal according to claim 1, wherein the SiC single crystal has a first orientation region the distance of which to a facet mark is $L_1$ in the SiC single crystal and a second region the distance of which to the facet mark is $L_2$, where the distance $L_2$ is greater than the distance $L_1$; and an orientation intensity B (=average of the three $A'_{ave.}(\theta_i)/B.G.(\theta_i)$ ratios) corresponding to the second orientation region is larger than the orientation intensity B corresponding to the first orientation region.

5. The SiC single crystal according to claim 1, wherein a peak value $A'_{ave.}(\theta_i)$ corresponding to the <1-100> direction in a power spectrum reflecting the orientation of a basal plane dislocation to the <11-20> direction forming the smallest angle with an offset downstream direction is the largest.

6. The SiC single crystal according to claim 1, wherein, in the at least one wafer cut out from the SiC single crystal, the proportion of a sum (S) of the area of the orientation regions to a sum ($S_0$) of the area of the measurement regions ($=S \times 100/S_0$) is 50% or more.

7. The SiC single crystal according to claim 1, wherein, in the at least one orientation region, an orientation intensity B (=average of the three $A'_{ave.}(\theta_i)/B.G.(\theta_i)$ ratios) is 1.2 or more.

8. The SiC single crystal according to claim 1, wherein the SiC single crystal does not contain a stacking fault.

9. An SiC wafer cut out in nearly parallel to a {0001} plane from the SiC single crystal according to claim 1.

10. The SiC wafer according to claim 9, wherein an epitaxial film is formed over a surface.

11. A semiconductor device manufactured by using the SiC wafer according to claim 9.

12. The semiconductor device according to claim 11, wherein the semiconductor device is a diode, a transistor, or an LED.

* * * * *